United States Patent
Shen et al.

(10) Patent No.: US 11,296,262 B2
(45) Date of Patent: Apr. 5, 2022

(54) MONOLITHIC SEGMENTED LED ARRAY ARCHITECTURE WITH REDUCED AREA PHOSPHOR EMISSION SURFACE

(71) Applicant: Lumileds LLC, San Jose, CA (US)

(72) Inventors: Yu-Chen Shen, Sunnyvale, CA (US); Luke Gordon, Santa Barbara, CA (US); Amil Ashok Patel, Palo Alto, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/226,226

(22) Filed: Dec. 19, 2018

(65) Prior Publication Data

US 2019/0198727 A1 Jun. 27, 2019

Related U.S. Application Data

(60) Provisional application No. 62/609,030, filed on Dec. 21, 2017.

(30) Foreign Application Priority Data

Mar. 1, 2018 (EP) ..................................... 18159512

(51) Int. Cl.
*H01L 33/50* (2010.01)
*H01L 27/15* (2006.01)
(Continued)

(52) U.S. Cl.
CPC ........ *H01L 33/505* (2013.01); *H01L 25/0753* (2013.01); *H01L 27/156* (2013.01);
(Continued)

(58) Field of Classification Search
CPC ....... H01L 33/40–405; H01L 33/44–46; H01L 33/50; H01L 33/505–507
See application file for complete search history.

(56) References Cited

U.S. PATENT DOCUMENTS

| | | | | |
|---|---|---|---|---|
| 5,943,586 | A * | 8/1999 | Koizumi | ................. H01L 33/20 257/797 |
| 6,410,942 | B1 | 6/2002 | Thibeault et al. | |

(Continued)

FOREIGN PATENT DOCUMENTS

| | | |
|---|---|---|
| DE | 102008025923 | 12/2009 |
| DE | 102016109308 | 11/2017 |

(Continued)

OTHER PUBLICATIONS

Extended European Search Report, corresponding to EP 18159512, dated Sep. 6, 2018, 14 pages.

(Continued)

*Primary Examiner* — Vincent Wall

(57) ABSTRACT

A device may include a wavelength converting layer on an epitaxial layer. The wavelength converting layer may include a first surface having a width that is equal to a width of the epitaxial layer, a second surface having a width that is less than the width of the first surface, and angled sidewalls. A conformal non-emission layer may be formed on the angled sidewalls and sidewalls of the epitaxial layer, such that the second surface of the wavelength converting layer is exposed.

19 Claims, 27 Drawing Sheets

(51) Int. Cl.

| | |
|---|---|
| *H01L 33/62* | (2010.01) |
| *H01L 33/44* | (2010.01) |
| *H01L 25/075* | (2006.01) |
| *H01L 33/10* | (2010.01) |
| *H01L 33/46* | (2010.01) |
| *H01L 33/20* | (2010.01) |
| *H01L 33/00* | (2010.01) |

(52) U.S. Cl.
CPC ............ *H01L 33/44* (2013.01); *H01L 33/504* (2013.01); *H01L 33/62* (2013.01); *H01L 33/0093* (2020.05); *H01L 33/10* (2013.01); *H01L 33/20* (2013.01); *H01L 33/46* (2013.01); *H01L 2933/0025* (2013.01); *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| 6,630,689 B2* | 10/2003 | Bhat | H01L 33/46 257/79 |
| 8,786,172 B2 | 7/2014 | Tsutsui et al. | |
| 8,957,428 B2* | 2/2015 | Jagt | H01L 33/46 257/88 |
| 9,666,771 B2 | 5/2017 | Schricker et al. | |
| 9,978,727 B2 | 5/2018 | Takeya et al. | |
| 9,997,688 B2 | 6/2018 | Takeya et al. | |
| 10,050,026 B2 | 8/2018 | Takeya et al. | |
| 2006/0081869 A1 | 4/2006 | Lu et al. | |
| 2006/0203468 A1* | 9/2006 | Beeson | H01L 33/60 362/84 |
| 2009/0039762 A1 | 2/2009 | Park et al. | |
| 2010/0258827 A1* | 10/2010 | Lee | H01L 24/26 257/98 |
| 2011/0114978 A1* | 5/2011 | Kojima | H01L 24/95 257/98 |
| 2012/0217524 A1* | 8/2012 | Sato | H01L 33/40 257/98 |
| 2013/0087823 A1* | 4/2013 | Tsai | H01L 33/38 257/98 |
| 2013/0285091 A1* | 10/2013 | Akimoto | H01L 33/44 257/98 |
| 2014/0167087 A1* | 6/2014 | Wada | H01L 33/505 257/98 |
| 2014/0367717 A1* | 12/2014 | Freund | H01L 33/20 257/98 |
| 2015/0243842 A1* | 8/2015 | Bhat | H01L 33/0066 257/98 |
| 2015/0325741 A1 | 11/2015 | Komada | |
| 2015/0372207 A1* | 12/2015 | Kim | H01L 33/62 257/98 |
| 2016/0149104 A1* | 5/2016 | Bergmann | H01L 33/647 257/88 |
| 2016/0190400 A1 | 6/2016 | Jung et al. | |
| 2017/0294417 A1 | 10/2017 | Edmond et al. | |
| 2017/0365746 A1* | 12/2017 | Vampola | H01L 33/58 |
| 2018/0019369 A1 | 1/2018 | Cho et al. | |
| 2018/0074372 A1 | 3/2018 | Takeya et al. | |
| 2018/0174519 A1 | 6/2018 | Kim et al. | |
| 2018/0210282 A1 | 7/2018 | Song et al. | |
| 2018/0226543 A1* | 8/2018 | Masui | H01L 33/505 |
| 2018/0240950 A1* | 8/2018 | Jang | H01L 33/20 |
| 2018/0283642 A1 | 10/2018 | Liao et al. | |
| 2018/0371315 A1 | 12/2018 | Hofmann et al. | |

FOREIGN PATENT DOCUMENTS

| | | | |
|---|---|---|---|
| EP | 2657995 | 10/2013 | |
| JP | 2012038889 A | 2/2012 | |
| TW | 200836378 A | 9/2008 | |
| TW | 201501366 A | 1/2015 | |
| TW | 201547070 A | 12/2015 | |
| TW | 201633503 A | 9/2016 | |
| TW | 201715756 A | 5/2017 | |
| WO | 2016/094422 | 6/2016 | |
| WO | 2017/023502 | 2/2017 | |
| WO | WO-2017023502 A1 * | 2/2017 | ............ H01L 33/46 |
| WO | 2017/102708 A1 | 6/2017 | |
| WO | 2018/091657 A1 | 5/2018 | |

OTHER PUBLICATIONS

International Search Report, corresponding to PCT US/2018/067182, dated Apr. 11, 2019, 5 pages.

Written Opinion of the International Searching Authority, corresponding to PCT US/2018/067182, Apr. 11, 2019, 5 pages.

* cited by examiner

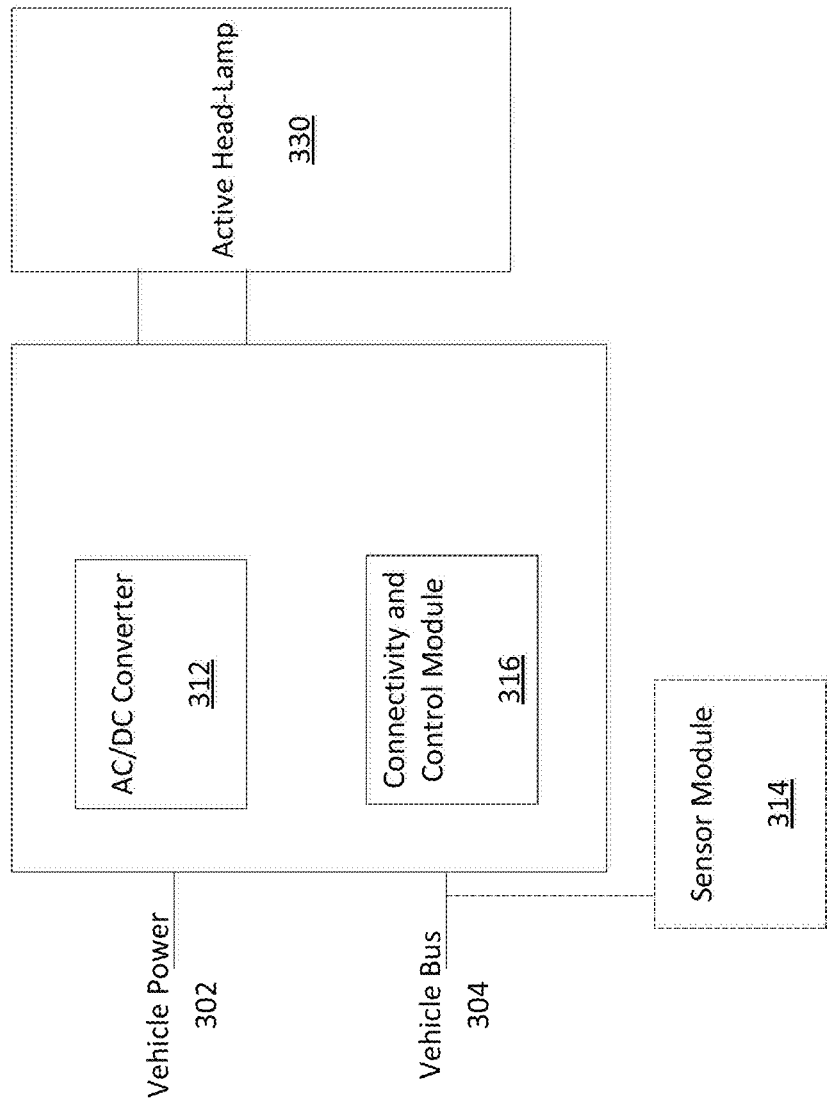

MONOLITHIC SEGMENTED LED ARRAY ARCHITECTURE WITH REDUCED AREA PHOSPHOR EMISSION SURFACE

CROSS REFERENCE TO RELATED APPLICATIONS

This application claims the benefit of U.S. Provisional Application No. 62/609,030 filed on Dec. 21, 2017 and EP Patent Application No. 18159512.5 filed on Mar. 1, 2018, the contents of which are hereby incorporated by reference herein.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials.

Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, silicon, formed over the substrate, one or more light emitting layers in an active region formed over the n-type layer or layers, and one or more p-type layers doped with, for example, magnesium, formed over the active region. Electrical contacts are formed on the n- and p-type regions.

SUMMARY

A device may include a wavelength converting layer on an epitaxial layer. The wavelength converting layer may include a first surface having a width that is equal to a width of the epitaxial layer, a second surface having a width that is less than the width of the first surface, and angled sidewalls. A conformal non-emission layer may be formed on the angled sidewalls and sidewalls of the epitaxial layer, such that the second surface of the wavelength converting layer is exposed.

BRIEF DESCRIPTION OF THE DRAWINGS

A more detailed understanding can be had from the following description, given by way of example in conjunction with the accompanying drawings wherein:

FIG. 1O shows forming the wavelength converting layer directly on a upper surface of the epitaxial layer;

FIG. 2C is an example vehicle headlamp system; and

DETAILED DESCRIPTION OF THE PREFERRED EMBODIMENTS

Figure 1A:
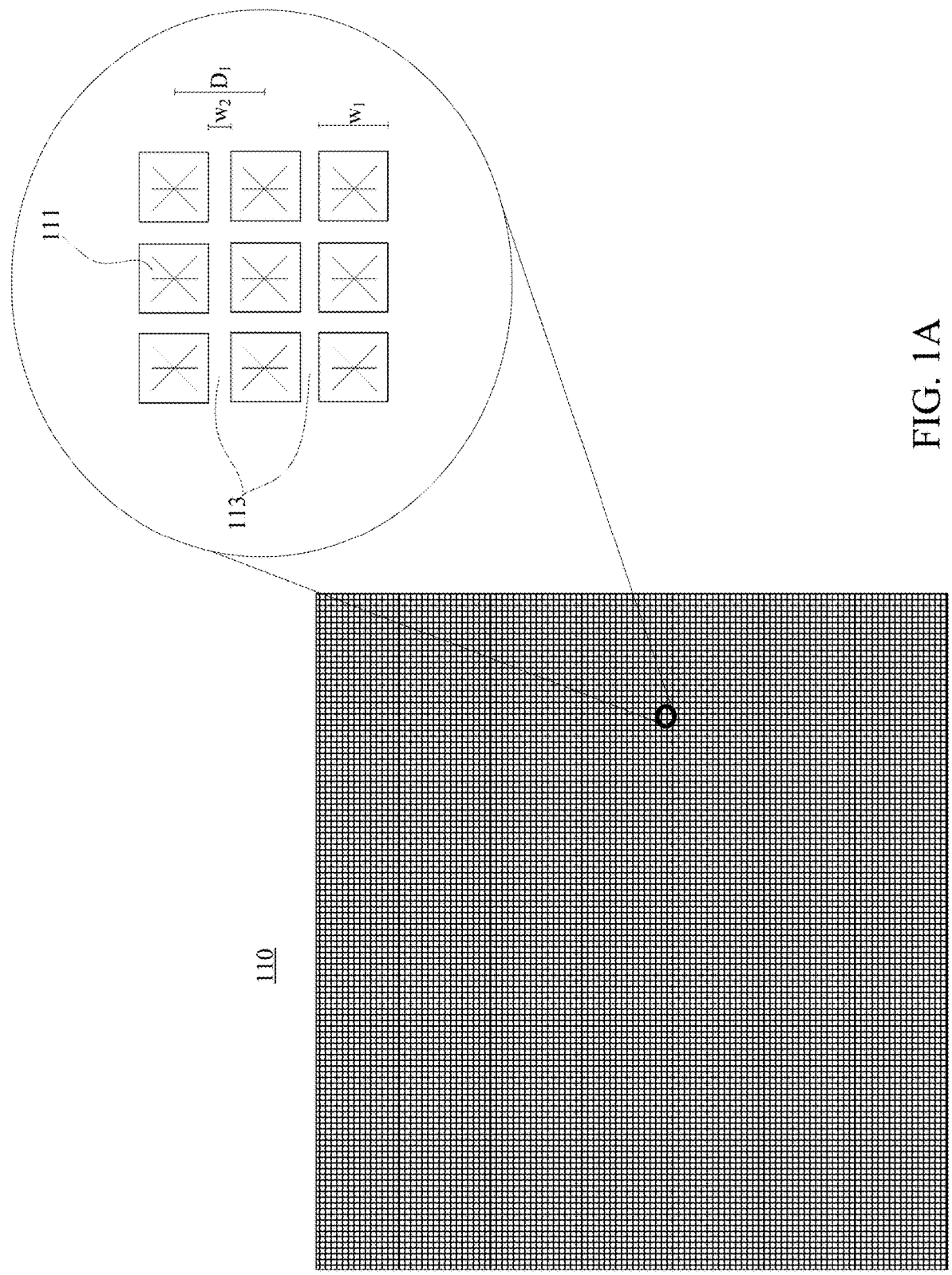
FIG. 1A is a top view illustration of an LED array with an exploded portion.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

Figure 1B:
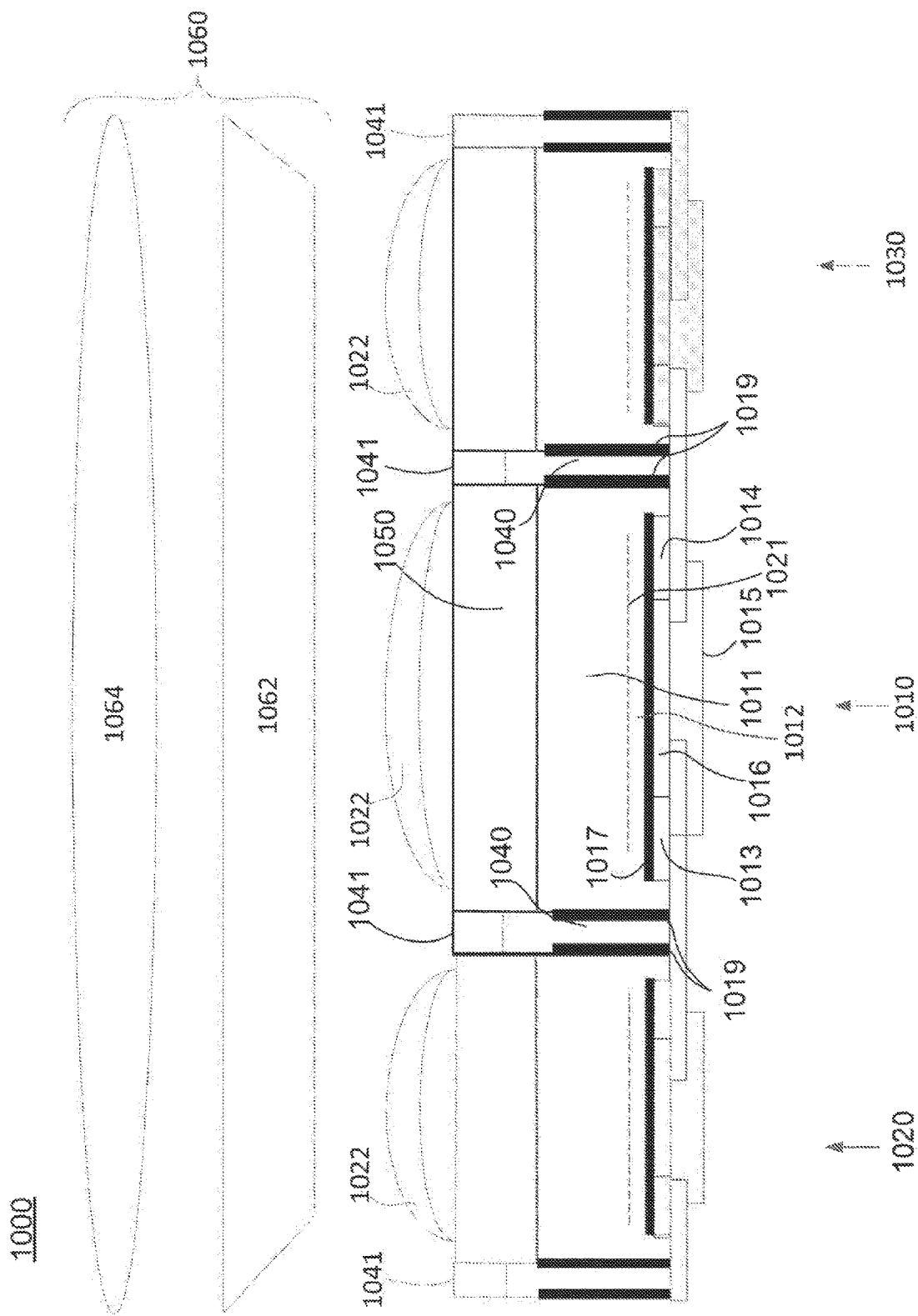
FIG. 1B is a cross sectional illustration of an LED array with trenches.
Figure 1C:
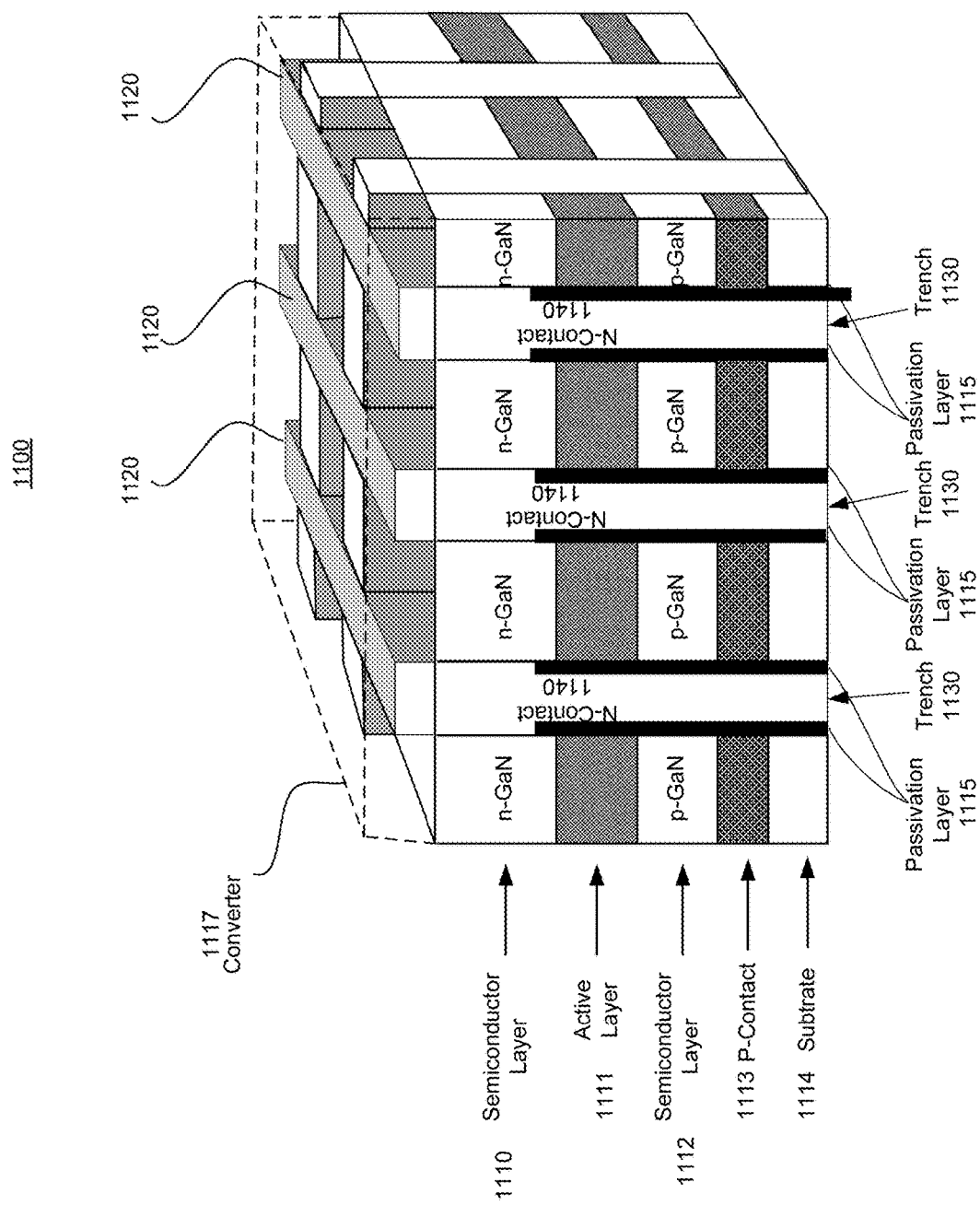
FIG. 1C is a perspective illustration of another LED array with trenches.

According to embodiments of the disclosed subject matter, LED arrays (e.g., micro LED arrays) may include an array of pixels as shown in FIGS. 1A, 1B, and/or 1C. LED arrays may be used for any applications such as those requiring precision control of LED array segments. Pixels in an LED array may be individually addressable, may be addressable in groups/subsets, or may not be addressable. In FIG. 1A, a top view of a LED array 110 with pixels 111 is shown. An exploded view of a 3×3 portion of the LED array 110 is also shown in FIG. 1A. As shown in the 3×3 portion exploded view, LED array 110 may include pixels 111 with a width w1 of approximately 100 µm or less (e.g., 40 µm). The lanes 113 between the pixels may be separated by a width, w2, of approximately 20 µm or less (e.g., 5 µm). The lanes 113 may provide an air gap between pixels or may contain other material, as shown in FIGS. 1B and 1C and further disclosed herein. The distance $D_1$ from the center of one pixel 111 to the center of an adjacent pixel 111 may be approximately 120 µm or less (e.g., 45 µm). It will be understood that the widths and distances provided herein are examples only, and that actual widths and/or dimensions may vary.

It will be understood that although rectangular pixels arranged in a symmetric matrix are shown in FIGS. 1A, B and C, pixels of any shape and arrangement may be applied to the embodiments disclosed herein. For example, LED array 110 of FIG. 1A may include, over 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

FIG. 1B shows a cross section view of an example LED array 1000. As shown, the pixels 1010, 1020, and 1030 correspond to three different pixels within an LED array such that a separation sections 1041 and/or n-type contacts 1040 separate the pixels from each other. According to an embodiment, the space between pixels may be occupied by an air gap. As shown, pixel 1010 includes an epitaxial layer 1011 which may be grown on any applicable substrate such as, for example, a sapphire substrate, which may be removed from the epitaxial layer 1011. A surface of the growth layer distal from contact 1015 may be substantially planar or may be patterned. A p-type region 1012 may be located in proximity to a p-contact 1017. An active region 1021 may be disposed adjacent to the n-type region and a p-type region 1012. Alternatively, the active region 1021 may be between a semiconductor layer or n-type region and p-type region 1012 and may receive a current such that the active region 1021 emits light beams. The p-contact 1017 may be in contact with SiO2 layers 1013 and 1014 as well as plated metal (e.g., plated copper) layer 1016. The n type contacts 1040 may include an applicable metal such as Cu. The metal layer 1016 may be in contact with a contact 1015 which may be reflective.

Notably, as shown in FIG. 1B, the n-type contact 1040 may be deposited into trenches created between pixels 1010, 1020, and 1030 and may extend beyond the epitaxial layer. Separation sections 1041 may separate all (as shown) or part of a wavelength converter layer 1050. It will be understood that a LED array may be implemented without such separation sections 1041 or the separation sections 1041 may correspond to an air gap. The separation sections 1041 may be an extension of the n-type contacts 1040, such that, separation sections 1041 are formed from the same material as the n-type contacts 1040 (e.g., copper). Alternatively, the separation sections 1041 may be formed from a material different than the n-type contacts 1040. According to an embodiment, separation sections 1041 may include reflective material. The material in separation sections 1041 and/or the n-type contact 1040 may be deposited in any applicable manner such as, for example, but applying a mesh structure which includes or allows the deposition of the n-type contact 1040 and/or separation sections 1041. As noted herein, one or more additional layers may coat the separation sections 1041. Such a layer may be a reflective layer, a scattering layer, an absorptive layer, or any other applicable layer. One or more passivation layers 1019 may fully or partially separate the n-contact 1040 from the epitaxial layer 1011.

The epitaxial layer 1011 may be formed from any applicable material to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors may have indices of refraction ranging from about 2.4 to about 4.1 at the typical emission wavelengths of LEDs in which they are present. For example, III-Nitride semiconductors, such as GaN, may have refractive indices of about 2.4 at 500 nm, and III-Phosphide semiconductors, such as InGaP, may have refractive indices of about 3.7 at 600 nm. Contacts coupled to the LED device 200 may be formed from a solder, such as AuSn, AuGa, AuSi or SAC solders.

The n-type region may be grown on a growth substrate and may include one or more layers of semiconductor material that include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Similarly, the p-type region 1012 may include multiple layers of different composition, thickness, and dopant concentrations, including layers that are not intentionally doped, or n-type layers. An electrical current may be caused to flow through the p-n junction (e.g., via contacts) and the pixels may generate light of a first wavelength determined at least in part by the bandgap energy of the materials. A pixel may directly emit light (e.g., regular or direct emission LED) or may emit light into a wavelength converting layer 1050 (e.g., phosphor converted LED, "POLED", etc.) that acts to further modify wavelength of the emitted light to output a light of a second wavelength.

Although FIG. 1B shows an example LED array 1000 with pixels 1010, 1020, and 1030 in an example arrangement, it will be understood that pixels in an LED array may be provided in any one of a number of arrangements. For example, the pixels may be in a flip chip structure, a vertical injection thin film (VTF) structure, a multi-junction structure, a thin film flip chip (TFFC), lateral devices, etc. For example, a lateral LED pixel may be similar to a flip chip LED pixel but may not be flipped upside down for direct connection of the electrodes to a substrate or package. A TFFC may also be similar to a flip chip LED pixel but may have the growth substrate removed (leaving the thin film semiconductor layers un-supported). In contrast, the growth substrate or other substrate may be included as part of a flip chip LED.

The wavelength converting layer 1050 may be in the path of light emitted by active region 1021, such that the light emitted by active region 1021 may traverse through one or more intermediate layers (e.g., a photonic layer). According to embodiments, wavelength converting layer 1050 or may not be present in LED array 1000. The wavelength converting layer 1050 may include any luminescent material, such as, for example, phosphor particles in a transparent or translucent binder or matrix, or a ceramic phosphor element, which absorbs light of one wavelength and emits light of a different wavelength. The thickness of a wavelength converting layer 1050 may be determined based on the material used or application/wavelength for which the LED array 1000 or individual pixels 1010, 1020, and 1030 is/are arranged. For example, a wavelength converting layer 1050 may be approximately 20 µm, 50 µm or 200 µm. The wavelength converting layer 1050 may be provided on each individual pixel, as shown, or may be placed over an entire LED array 1000.

Primary optic 1022 may be on or over one or more pixels 1010, 1020, and/or 1030 and may allow light to pass from the active region 101 and/or the wavelength converting layer 1050 through the primary optic. Light via the primary optic may generally be emitted based on a Lambertian distribution pattern such that the luminous intensity of the light emitted via the primary optic 1022, when observed from an ideal diffuse radiator, is directly proportional to the cosine of the angle between the direction of the incident light and the surface normal. It will be understood that one or more properties of the primary optic 1022 may be modified to produce a light distribution pattern that is different than the Lambertian distribution pattern.

Secondary optics which include one or both of the lens 1064 and waveguide 1062 may be provided with pixels 1010, 1020, and/or 1030. It will be understood that although secondary optics are discussed in accordance with the example shown in FIG. 1B with multiple pixels, secondary optics may be provided for single pixels. Secondary optics may be used to spread the incoming light (diverging optics), or to gather incoming light into a collimated beam (collimating optics). The waveguide 1062 may be coated with a dielectric material, a metallization layer, or the like and may be provided to reflect or redirect incident light. In alternative embodiments, a lighting system may not include one or more of the following: the wavelength converting layer 1050, the primary optics 1022, the waveguide 1062 and the lens 1064.

Lens 1064 may be formed form any applicable transparent material such as, but not limited to SiC, aluminum oxide, diamond, or the like or a combination thereof. Lens 1064 may be used to modify the beam of light to be input into the lens 1064 such that an output beam from the lens 1064 will efficiently meet a desired photometric specification. Additionally, lens 1064 may serve one or more aesthetic purpose, such as by determining a lit and/or unlit appearance of the multiple LED devices 200B.

FIG. 1C shows a cross section of a three dimensional view of a LED array 1100. As shown, pixels in the LED array 1100 may be separated by trenches which are filled to form n-contacts 1140. The pixels may be grown on a substrate 1114 and may include a p-contact 1113, a p-GaN semiconductor layer 1112, an active region 1111, and an n-Gan semiconductor layer 1110. It will be understood that this structure is provided as an example only and one or more semiconductor or other applicable layers may be added, removed, or partially added or removed to implement the disclosure provided herein. A converter material 1117 may be deposited on the semiconductor layer 1110 (or other applicable layer).

Passivation layers 1115 may be formed within the trenches 1130 and n-contacts 1140 (e.g., copper contacts) may be deposited within the trenches 1130, as shown. The passivation layers 1115 may separate at least a portion of the n-contacts 1140 from one or more layers of the semiconductor. According to an implementation, the n-contacts 1140, or other applicable material, within the trenches may extend into the converter material 1117 such that the n-contacts 1140, or other applicable material, provide complete or partial optical isolation between the pixels.

Manufacturing small addressable light LED pixel systems may be costly and difficult due to pixel size. Light cross-talk between pixels may be a serious problem and achieving a desired luminance for each pixel may be difficult. The following description includes methods of selectively increasing luminance while limiting optical cross-talk between LED pixels. This may be achieved by attaching a phosphor cap to a semiconductor mesa of a light emitter devices having a smaller area than the semiconductor mesa itself. The remaining area of the semiconductor mesa may be coated with a reflective or absorption layer.

Figure 1D:
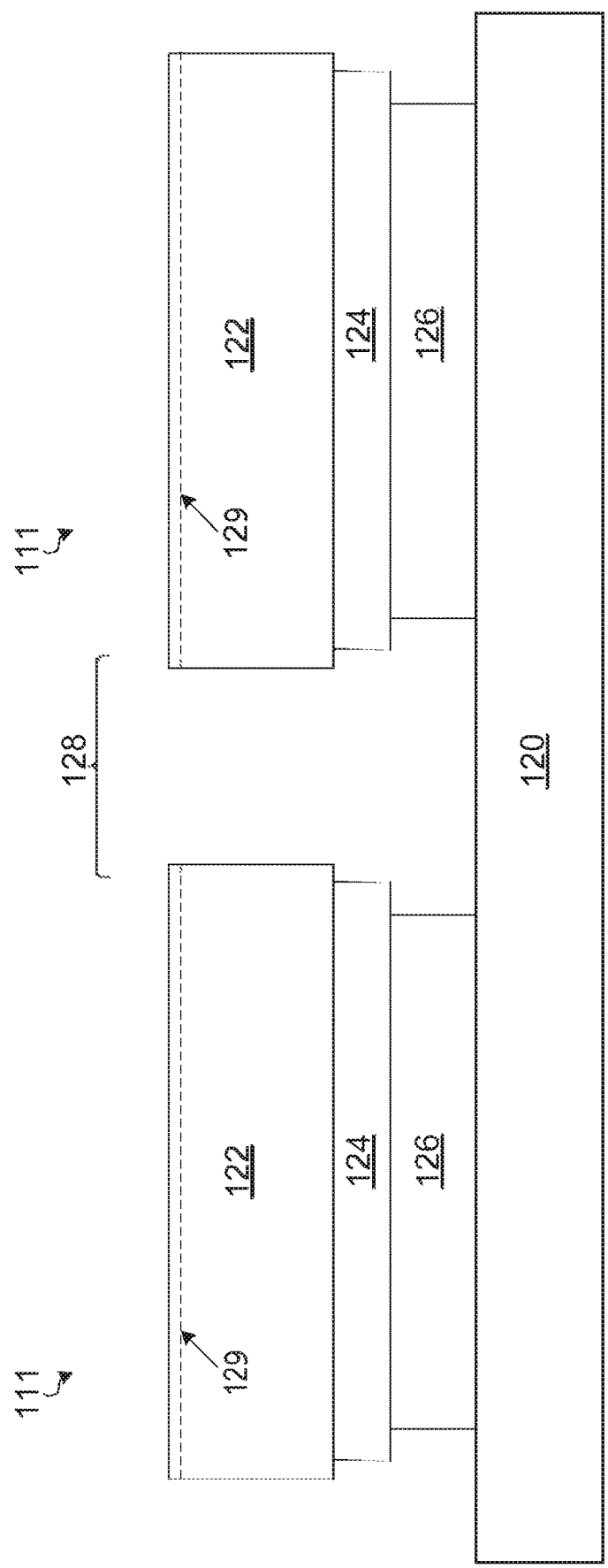
FIG. 1D is a cross-section view of a pixel.

Referring now to FIG. 1D, a cross-section view of one or more pixels 111 is shown. Although FIG. 1D illustrates a thin film flip chip device, other types of devices may be used, such as vertical devices, where the n-type contact layers and p-type contact layers are formed on opposite sides of the device, a device where both contacts are formed on the same side of the device and light is extracted through the contacts, or a flip chip device in which the growth substrate remains a part of the device.

Each pixel 111 may include an epitaxial layer 122. Although the epitaxial layer 122 is shown as one layer, it may include one or more layers of varying compositions. The epitaxial layer 122 may include an n-type region, a light emitting or active region, and a p-type region. The epitaxial layer 122 may be grown on a growth substrate 123 as shown in FIG. 1I. The growth substrate 123 may compose, for example, sapphire, SiC, GaN, Si, strain-reducing templates grown over a growth substrate such as sapphire, or a composite substrate such as, for example, an InGaN seed layer bonded to a sapphire host. The growth substrate 123 may be substantially transparent to light emitted from each pixel 111. In an example, the growth substrate 123 may be removed from the epitaxial layer 122 to form the pixels 111. In another example, as shown in FIG. 1I, the growth substrate 123 may remain on the epitaxial layer 122.

The n-type region may be grown first and may include multiple layers of different compositions and dopant concentration including, for example, preparation layers such as buffer layers or nucleation layers, which may be n-type or not intentionally doped, release layers designed to facilitate later release of the composite substrate or thinning of the semiconductor structure after substrate removal, and n-type or even p-type device layers designed for particular optical or electrical properties desirable for the light emitting region to efficiently emit light. A light emitting or active region may be grown over the n-type region. Examples of suitable light emitting regions include a single thick or thin light emitting layer, or a multiple quantum well light emitting region including multiple thin or thick quantum well light emitting layers separated by barrier layers. A p-type region may be grown over the light emitting region. Like the n-type region, the p-type region may include multiple layers of different composition, thickness, and dopant concentration, including layers that are not intentionally doped, or n-type layers.

A p-contact layer 124 may be formed in contact with the p-type region of the epitaxial layer 122. The p-contact layer 124 may include a reflective layer, such as silver. The p-contact layer 124 may include other optional layers, such as an ohmic contact layer and a guard sheet including, for example, titanium and/or tungsten. Although not shown in FIG. 1D, a portion of the p-contact layer 124, the p-type region, and the active region may be removed to expose a portion of the n-type region on which an n-contact layer may be formed.

A pixel 111 may be separated from another pixel 111 by a trench 128. The trench 128 may extend through an entire thickness of the epitaxial layer 122 and may be formed between each pixel 111 to electrically isolate adjacent segments. The trench 128 may be filled with a dielectric material such as an oxide of silicon or a nitride of silicon formed by plasma enhanced chemical vapor deposition. It should be noted that the trench 128, may include an isolating material formed by, for example, implantation of dopant atoms into the semiconductor material used to form the epitaxial layer 122 to cause a region between the pixels 111.

Interconnects (not shown in FIG. 1D) may be formed on the p-contact layer 124 and the n-contact layer and/or the mount. The interconnects may be any suitable material, such as solder or other metals, and may include multiple layers of materials. A bonding layer 126 may be formed on the p-contact layer 124. The bonding layer 126 may include a conductive metal, for example, gold or an alloy thereof. The bonding layer 126 may be mounted to the mount 120. The mount 120 may be any suitable material, including, for example, silicon, ceramic, AlN, and alumina. In an example the bond between the pixel 111 and the mount 120 may be formed by ultrasonic bonding. During ultrasonic bonding, the pixel 111 may be positioned on the mount 120. A bond head is positioned on the top surface of the pixel 111, for example on the top surface of the growth substrate. The bond head may be connected to an ultrasonic transducer. The ultrasonic transducer may be, for example, a stack of lead zirconate titanate (PZT) layers.

When a voltage is applied to the transducer at a frequency that causes the system to resonate harmonically (often a frequency on the order of tens or hundreds of kHz), the transducer begins to vibrate, which in turn causes the bond head and the pixel 111 to vibrate, often at an amplitude on the order of microns. The vibration causes atoms in the metal lattice of a structure on the pixel 111, such as the n-contact layer, the p-contact layer 124 or interconnects formed on the n-contact layer and p-contact layer, to interdiffuse with a structure on the mount 120, resulting in a metallurgically continuous joint. Heat and/or pressure may be added during bonding.

After the pixel 111 is bonded to the mount 120, all or part of the growth substrate (not shown) may be removed. For example, a sapphire growth substrate or a sapphire host substrate that is part of a composite substrate may be removed by laser melting of a III-nitride or other layer at an interface with the sapphire substrate. Other techniques such as etching or mechanical techniques such as grinding may be used as appropriate to the substrate being removed. After the growth substrate is removed, the epitaxial layer 122 may be thinned, for example by photoelectrochemical (PEC) etching. The exposed surface of the n-type region of the epitaxial layer 122 may be textured to form a pattern 129, for example by roughening or by forming a photonic crystal. The pattern 129 may be a result of growing the epitaxial layer 122 on a patterned sapphire substrate.

Figure 1E:
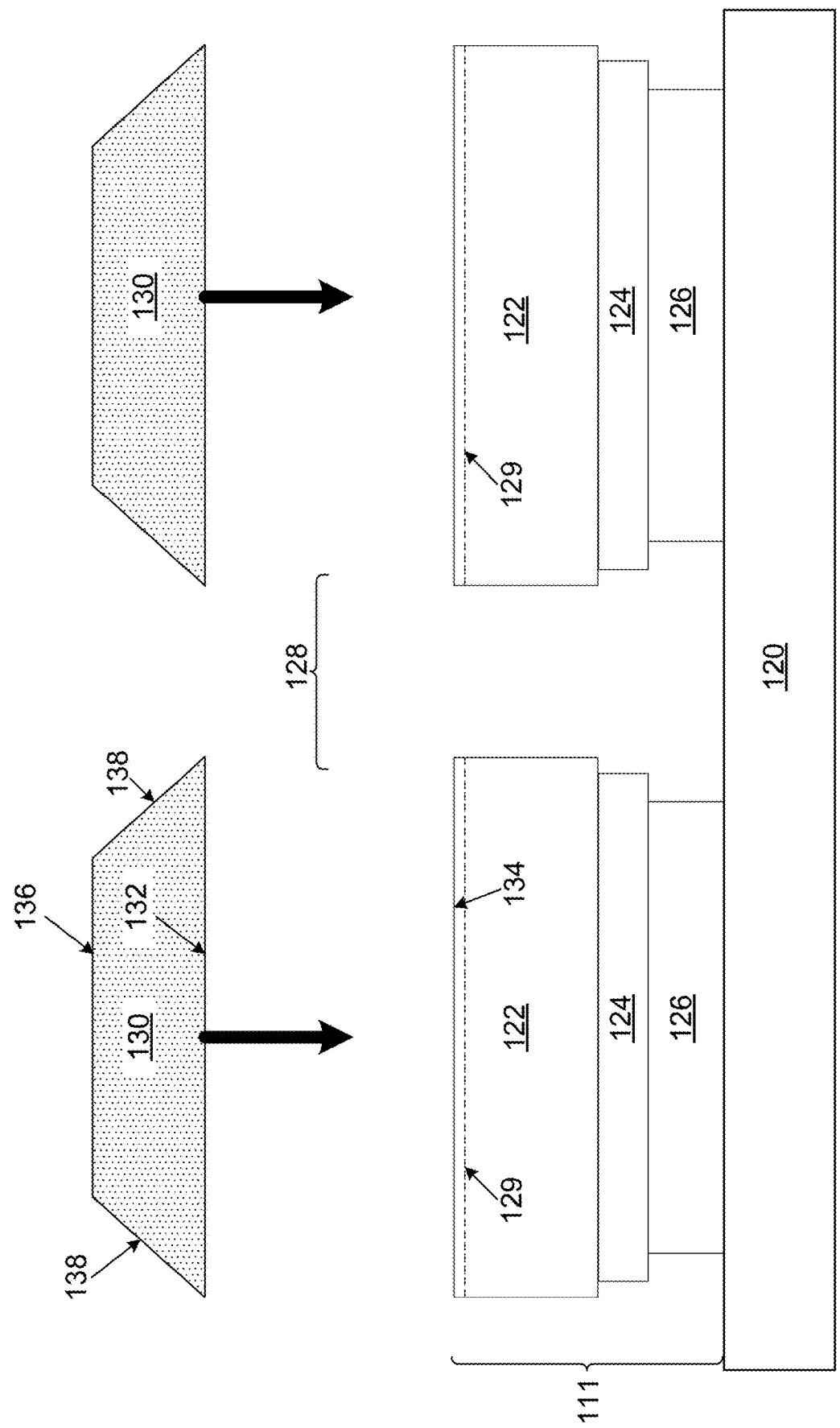
FIG. 1E shows a pre-formed wavelength converting layer being formed on an epitaxial layer.

Referring now to FIGS. 1E-1H, cross-section views illustrating a first example of forming the wavelength converting layer 130 on the epitaxial layer 122 are shown. FIG. 1E shows a pre-formed wavelength converting layer 130 being formed on the epitaxial layer 122. The wavelength converting layer 130 may include one or more wavelength converting materials. The one or more wavelength converting materials may be, for example, one or more powder phosphors disposed in a transparent material such as silicone or epoxy and deposited on the LED by screen printing or stenciling. The one or more wavelength converting materials may be one or more powder phosphors formed by electrophoretic deposition, spraying, sedimenting, evaporation, or sputtering. The one or more wavelength converting materials may be one or more ceramic phosphors glued or bonded to the pixel 111. The wavelength converting materials may be formed such that a portion of light emitted by the light emitting region may be unconverted by the wavelength converting material. In some examples, the unconverted light may be blue and the converted light may be yellow, green, and/or red, such that the combination of unconverted and converted light emitted from the device appears white. The wavelength converting layer 130 may be individually formed on each pixel 111.

The wavelength converting layer 130 may include elemental phosphor or compounds thereof. The wavelength converting layer 130 may contain one or more phosphors. Phosphors are luminescent materials that may absorb an excitation energy (usually radiation energy), and then emit the absorbed energy as radiation of a different energy than the initial excitation energy. The phosphors may have quantum efficiencies near 100%, meaning nearly all photons provided as excitation energy may be reemitted by the phosphors. The phosphors may also be highly absorbent. Because the light emitting active region may emit light directly into the highly efficient, highly absorbent wavelength converting layer 130, the phosphors may efficiently extract light from the device. The phosphors used in the wavelength converting layer 130 may include, but are not limited to any conventional green, yellow, and red emitting phosphors.

The wavelength converting layer 130 may contain phosphor grains. The phosphor grains may be in direct contact with the epitaxial layer 122, such that light emitted from the active region may be directly coupled to the phosphor grains. An optical coupling medium may be provided to hold the phosphor grains in place. The optical coupling medium may be selected to have a refractive index that is as close as possible without significantly exceeding the index of refraction of the epitaxial layer 122. For most efficient operation, no lossy media may be included between the epitaxial layer 122, the phosphor grains of the wavelength converting layer 130, and the optical coupling medium. The phosphor grains may have a grain size between 0.1 μm and 20 μm.

The wavelength converting layer 130 may be a ceramic phosphor. A ceramic phosphor may be formed by heating a powder phosphor at high pressure until the surface of the phosphor particles begin to soften and melt. The partially-melted particles may stick together to form a rigid agglomerate of particles. Uniaxial or isostatic pressing steps and vacuum sintering of the preformed "green body" may be necessary to form a polycrystalline ceramic layer. The translucency of the ceramic phosphor (i.e., the amount of scattering it produces) may be controlled from high opacity to high transparency by adjusting the heating or pressing conditions, the fabrication method, the phosphor particle precursor used, and the suitable crystal lattice of the phosphor material. Besides phosphor, other ceramic forming materials such as alumina may be included, for example to facilitate formation of the ceramic or to adjust the refractive index of the ceramic. In another example, the wavelength converting layer 130 may include a mixture of silicone and phosphor particles.

The wavelength converting layer 130 may be formed using a mold or may be diced from plates and etched such that it has it has a lower surface 132 that is substantially similar in width as an upper surface 134 of the epitaxial layer 122. The wavelength converting layer 130 may have an upper surface 136 that is smaller than the width of the upper surface 134 of the epitaxial layer 122. In an example, the upper surface 136 may have a width such than the upper surface 136 has an overall area that is than approximately 80% to approximately 90% of the upper surface 134 of the epitaxial layer 122. The wavelength converting layer 130 may have sidewalls 138 connecting the upper surface 136 and the lower surface 132. The sidewalls 138 may be angled. In an example, the sidewalls 138 may be angled between approximately 30 degrees and approximately 60 degrees in relation to the upper surface 134 of the epitaxial layer 122. The sidewalls 138 may have an angle great enough to reduce reflections within the wavelength converting layer 130 and shallow enough to reduce the need for a thick wavelength converting layer 130, both of which may reduce efficiency.

Figure 1F:
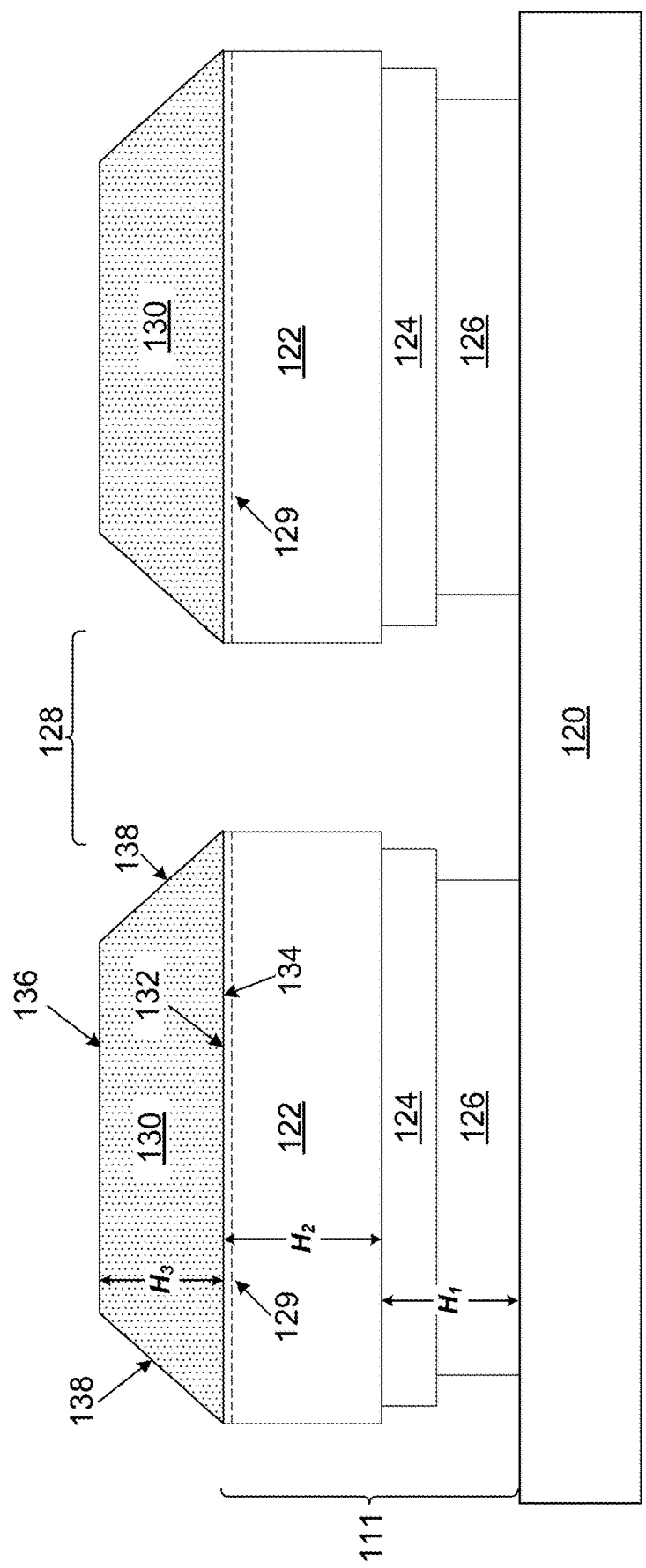
FIG. 1F shows the wavelength converting layer being applied to the epitaxial layer.

FIG. 1F shows the wavelength converting layer 130 being applied to the epitaxial layer 122. The wavelength converting layer 130 may be affixed to an upper surface 144 of the epitaxial layer 122. In an example, the wavelength converting layer 130 may be affixed using glue or an epoxy known in the art. The bonding layer 126 and the p-contact layer may have a height of $H_1$. The epitaxial layer 122 may have a height of $H_2$. The wavelength converting layer 130 may have a height of $H_3$. In an example, $H_3$ may be approximately 5 times larger than $H_2$. In addition, $H_1$ may be approximately 6 times larger than $H_2$. For example, $H_1$ may be approximately 47 μm, $H_2$ may be approximately 6 μm and $H_3$ may be approximately 30 μm. In other example, $H_3$ may be approximately equal to $H_2$. For example, $H_2$ may be approximately 6 μm and $H_3$ may be approximately 10 μm. In other example, $H_3$ may be ten times greater than $H_2$. For example, $H_2$ may be approximately 6 μm and $H_3$ may be approximately 60 μm. $H_1$ may range from approximately 25 μm to approximately 100 μm. $H_2$ may range from approximately 3 μm to approximately 20 μm. $H_3$ may range from approximately 5 μm to approximately 100 μm.

Figure 1G:
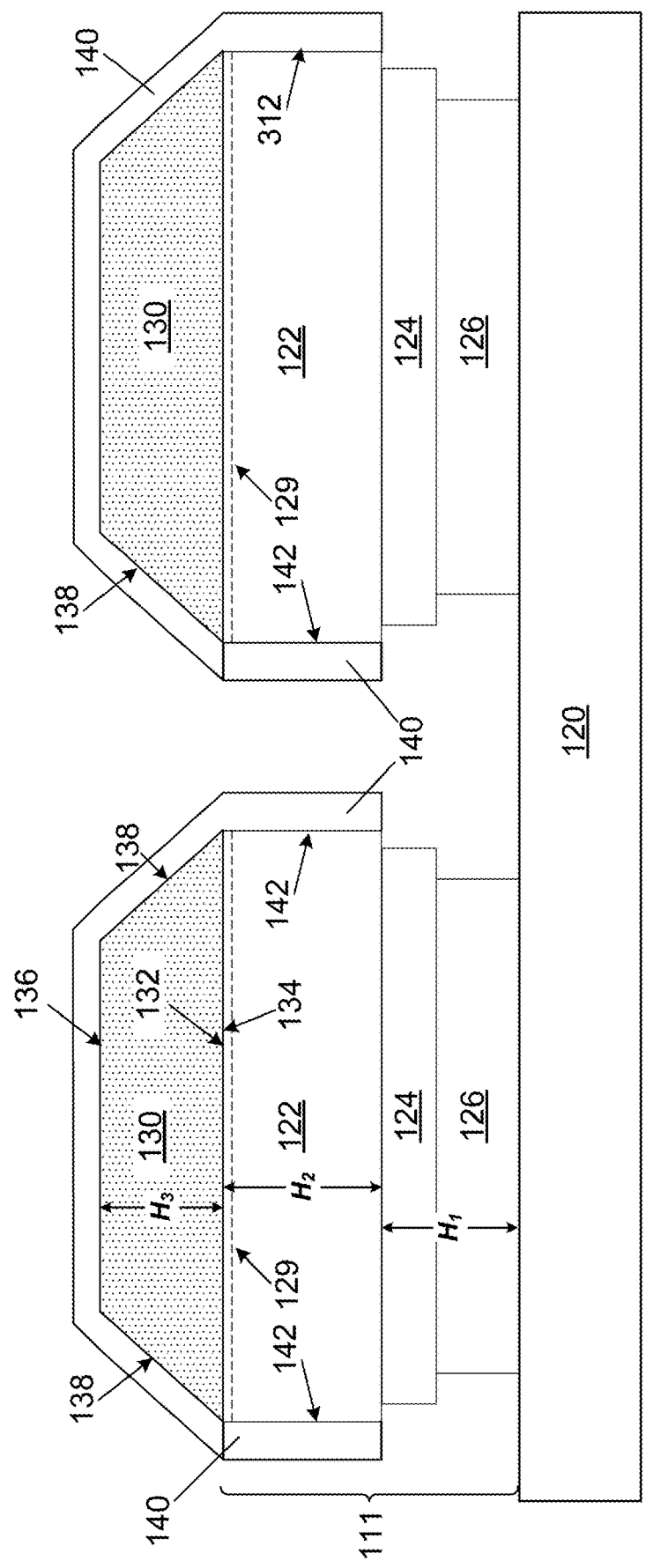
FIG. 1G shows the formation of a non-emission layer on the wavelength converting layer and the epitaxial layer.

FIG. 1G shows the formation of the non-emission layer 140 on the wavelength converting layer 130 and the epitaxial layer 122. The non-emission layer 140 may reflect or absorb light emitted by the epitaxial layer 122 and the wavelength converting layer 130. The non-emission layer 140 may include one or more optical isolation materials such as distributed Bragg reflector (DBR) layers, reflective materials (e.g., $TiO_2$), absorptive materials, or the like. The non-emission layer 140 may include combinations of DBR, absorbers, laser blackened areas, and metallization to improve optical isolation between the pixels 111 and reduce the exposed upper surface 148 of the wavelength converting layer 130.

The non-emission layer 140 may be formed using a conformal deposition process, such as, for example, atomic layer deposition (ALD). The non-emission layer 140 may be formed on sidewalls of the epitaxial layer 122, the sidewalls 138 of the wavelength converting layer 130 and the upper surface 136 of the wavelength converting layer 130. The sidewalls 138 of the wavelength converting layer 130 and the sidewalls 142 of the epitaxial layer 122 may be partially or completed covered by the non-emission layer 140. The non-emission layer 140 may extend across the trench 128 from the sidewalls 138 of one wavelength converting layer 130 to the sidewalls 138 of another wavelength converting layer 130. In another example, the non-emission layer 140 may be formed on the isolation layer and the epitaxial layer 122 before the wavelength converting layer 130 is affixed.

Figure 1H:
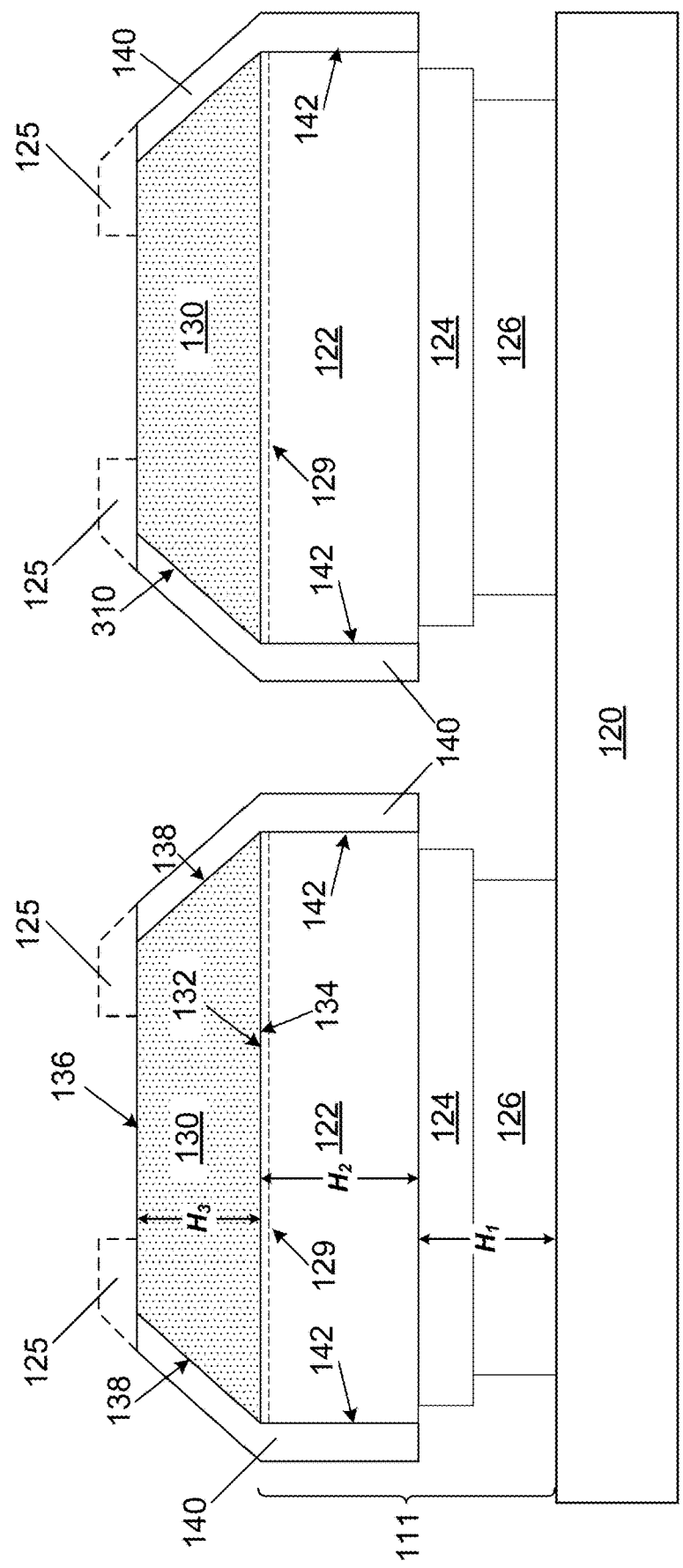
FIG. 1H shows removing a portion of the non-emission layer to expose an upper surface of the wavelength converting layer.
Figure 1I:
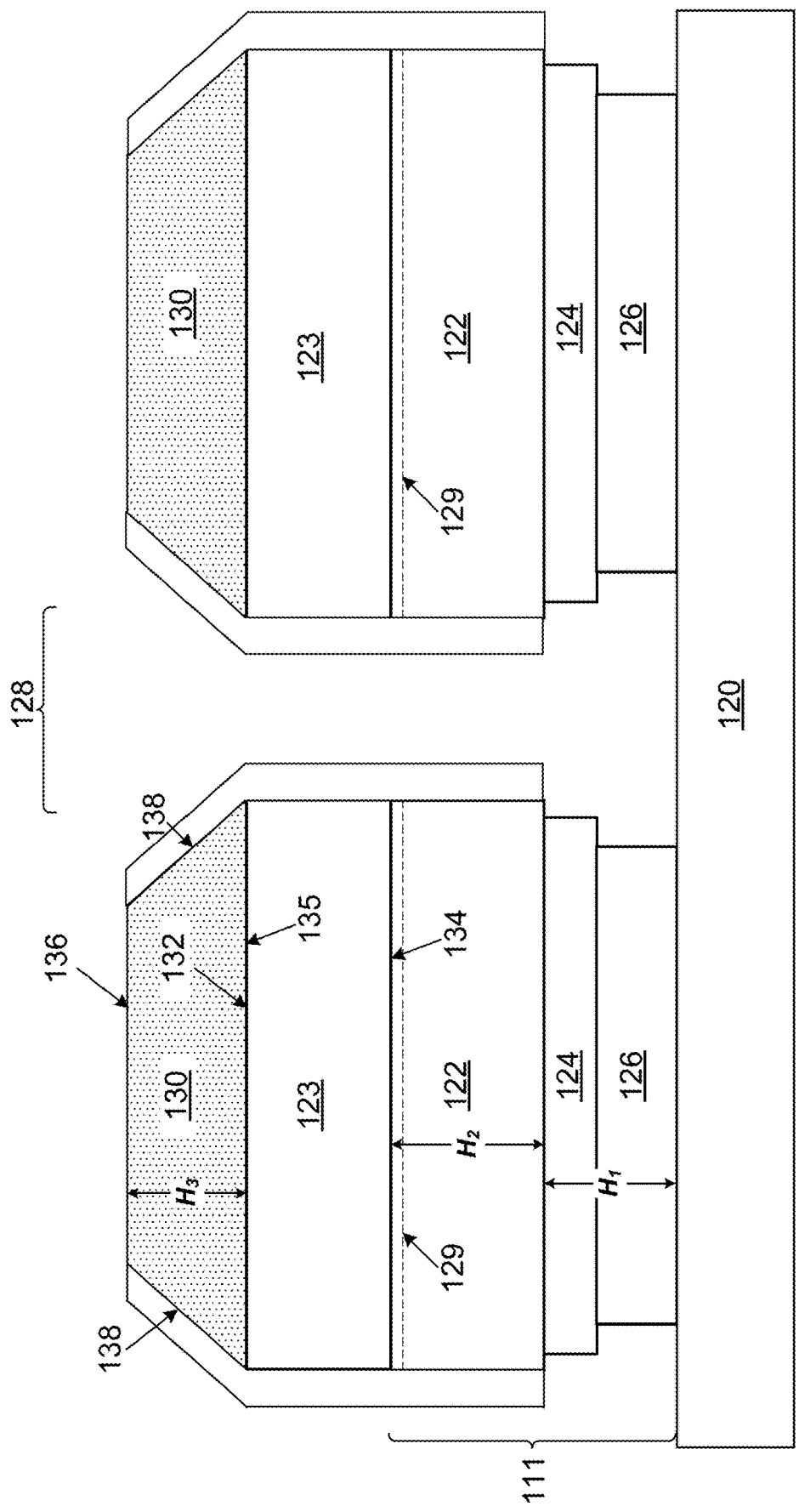
FIG. 1I shows an alternative example of FIGS. 1D-1H in which a growth substrate is left on the epitaxial layer.

FIG. 1H shows removing a portion of the non-emission layer 140 to expose the upper surface 136 of the wavelength converting layer 130. The portion of the non-emission layer may be removed using conventional grinding techniques, such as, for example planarization and chemical mechanical planarization (CMP). Optionally, portions of the non-emission layer 140 may be removed from the upper surface 136 using a conventional patterning and etching process, such that portions 125 of non-emission layer remain on the upper surface 136. It should be noted that these portions 125 may remain on any of the embodiments described herein.

FIG. 1I shows an alternative example of FIGS. 1D-1H in which the growth substrate 123 is left on the epitaxial layer 122. Similar processing steps as those described above may be performed to form the pixels 111, form the wavelength converting layer 130 and form the non-emission layer 140. In this example, the wavelength converting layer 130 may be formed on the growth substrate 123. The lower surface 132 may have a width that as an upper surface 135 of the growth substrate 123. The upper surface 136 may have a width that is smaller than the width of the upper surface 135 of the growth substrate 123. In an example, the upper surface 136 may have a width such than the upper surface 136 has an overall area that is than approximately 80% to approximately 90% of the upper surface 135 of the growth substrate. The wavelength converting layer 130 may have sidewalls 138 connecting the upper surface 136 and the lower surface 132. The sidewalls 138 may be angled. In an example, the sidewalls 138 may be angled between approximately 30 degrees and approximately 60 degrees in relation to the upper surface 135 of the growth substrate 123. The sidewalls 138 may have an angle great enough to reduce reflections within the wavelength converting layer 130 and shallow enough to reduce the need for a thick wavelength converting layer 130, both of which may reduce efficiency.

It should be noted that the growth substrate 123 may remain on the epitaxial layer 122, and may be between the epitaxial layer 122 and the wavelength converting layer 130, in any of the embodiments described herein.

Figure 1J:
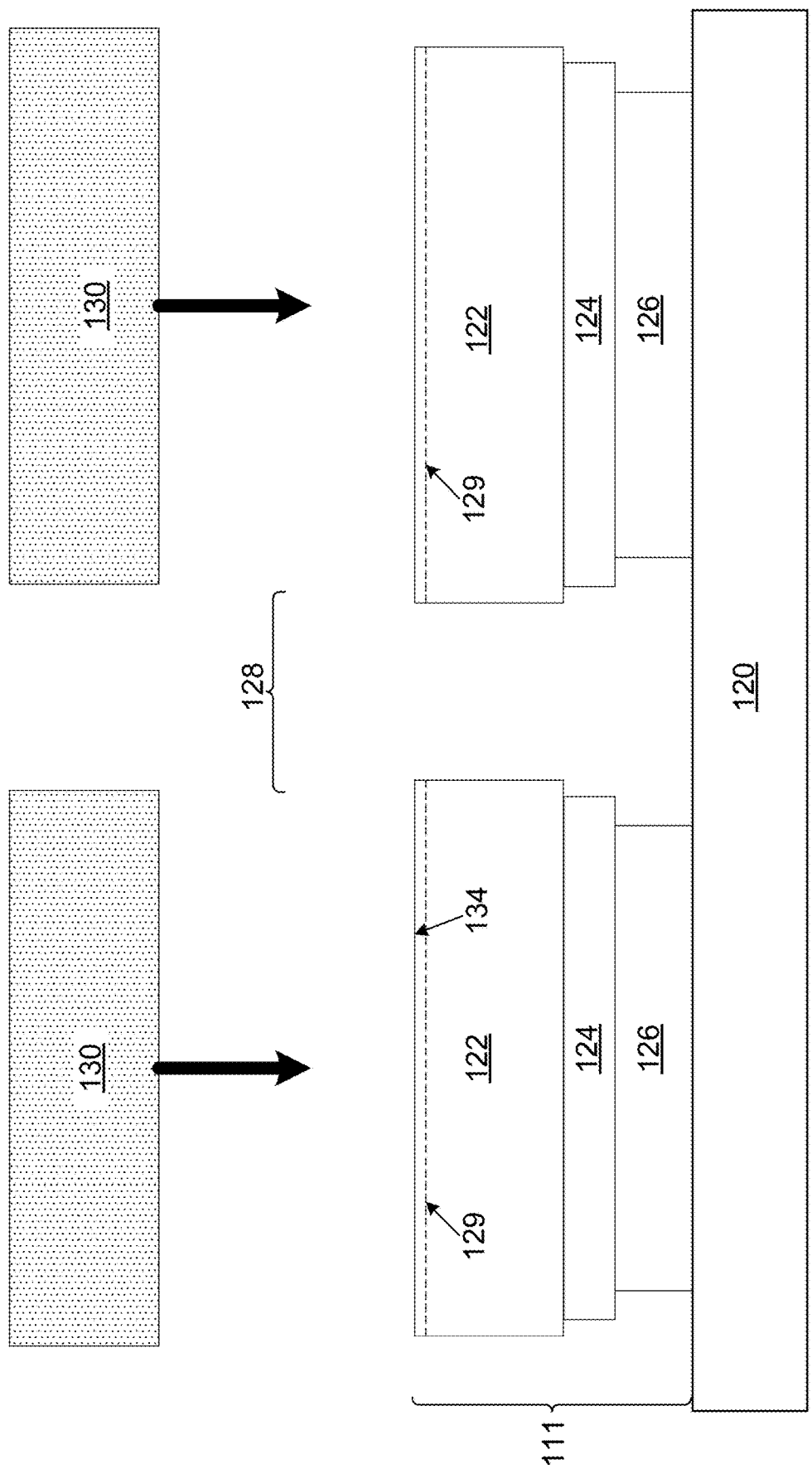
FIG. 1J shows the wavelength converting layer being formed on the epitaxial layer.

Referring now to FIGS. 1J-1N, cross-section views illustrating another example of forming the wavelength converting layer 130 on the epitaxial layer 122 are shown. FIG. 1J shows the wavelength converting layer 130 being formed on the epitaxial layer 122. The wavelength converting layer 130 may include one or more wavelength converting materials. The one or more wavelength converting materials may be, for example, one or more powder phosphors disposed in a transparent material such as silicone or epoxy and deposited on the LED by screen printing or stenciling. The one or more wavelength converting materials may be one or more powder phosphors formed by electrophoretic deposition, spraying, sedimenting, evaporation, or sputtering. The one or more wavelength converting materials may be one or more ceramic phosphors glued or bonded to the pixel 111. The wavelength converting materials may be formed such that a portion of light emitted by the light emitting region may be unconverted by the wavelength converting material. In some examples, the unconverted light may blue and the converted light may be yellow, green, and/or red, such that the combination of unconverted and converted light emitted from the device appears white. The wavelength converting layer 130 may be individually formed on each pixel 111.

The wavelength converting layer 130 may include elemental phosphor or compounds thereof. The wavelength converting layer 130 may contain one or more phosphors. Phosphors are luminescent materials that may absorb an excitation energy (usually radiation energy), and then emit the absorbed energy as radiation of a different energy than the initial excitation energy. The phosphors may have quantum efficiencies near 100%, meaning nearly all photons provided as excitation energy may be reemitted by the phosphors. The phosphors may also be highly absorbent. Because the light emitting active region may emit light directly into the highly efficient, highly absorbent wavelength converting layer 130, the phosphors may efficiently extract light from the device. The phosphors used in the wavelength converting layer 130 may include, but are not limited to any conventional green, yellow, and red emitting phosphors.

The wavelength converting layer 130 may contain phosphor grains. The phosphor grains may be in direct contact with the epitaxial layer 122, such that light emitted from the active region may be directly coupled to the phosphor grains. An optical coupling medium may be provided to hold the phosphor grains in place. The optical coupling medium may be selected to have a refractive index that is as close as possible without significantly exceeding the index of refraction of the epitaxial layer 122. For most efficient operation, no lossy media may be included between the epitaxial layer 122, the phosphor grains of the wavelength converting layer 130, and the optical coupling medium. The phosphor grains may have a grain size between 0.1 μm and 20 μm.

The wavelength converting layer 130 may be a ceramic phosphor, A ceramic phosphor may be formed by heating a powder phosphor at high pressure until the surface of the phosphor particles begin to soften and melt. The partially-melted particles may stick together to form a rigid agglomerate of particles. Uniaxial or isostatic pressing steps and vacuum sintering of the preformed "green body" may be necessary to form a polycrystalline ceramic layer. The translucency of the ceramic phosphor (i.e., the amount of scattering it produces) may be controlled from high opacity to high transparency by adjusting the heating or pressing conditions, the fabrication method, the phosphor particle precursor used, and the suitable crystal lattice of the phosphor material. Besides phosphor, other ceramic forming materials such as alumina may be included, for example to facilitate formation of the ceramic or to adjust the refractive index of the ceramic. In another example, the wavelength converting layer 130 may include mixture of silicone and phosphor particles. The wavelength converting layer 130 may be formed using a mold or diced from plates.

Figure 1K:
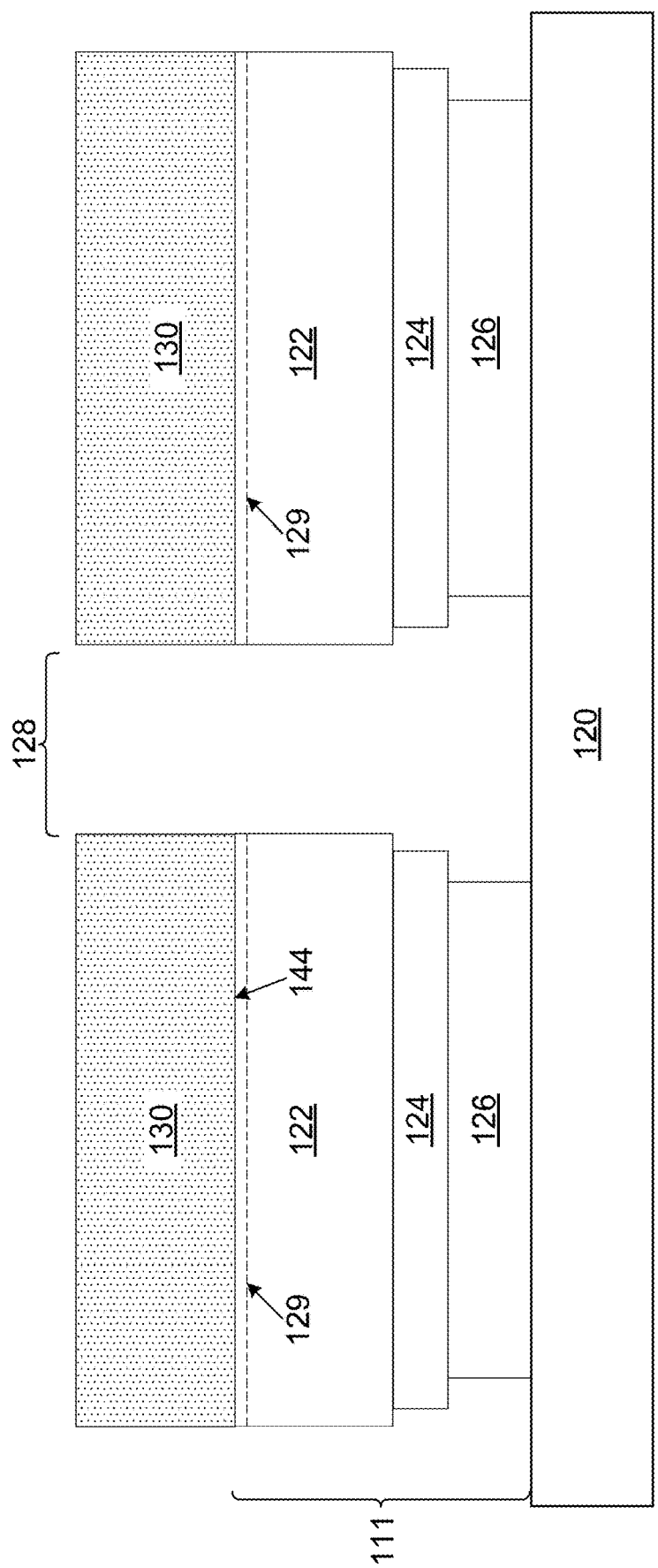
FIG. 1K shows the wavelength converting layer being applied to the epitaxial layer.

FIG. 1K shows the wavelength converting layer 130 being applied to the epitaxial layer 122. The wavelength converting layer 130 may be affixed to the upper surface 134 of the epitaxial layer 122. In an example, the wavelength converting layer 130 may be affixed using glue or an epoxy known in the art.

Figure 1L:
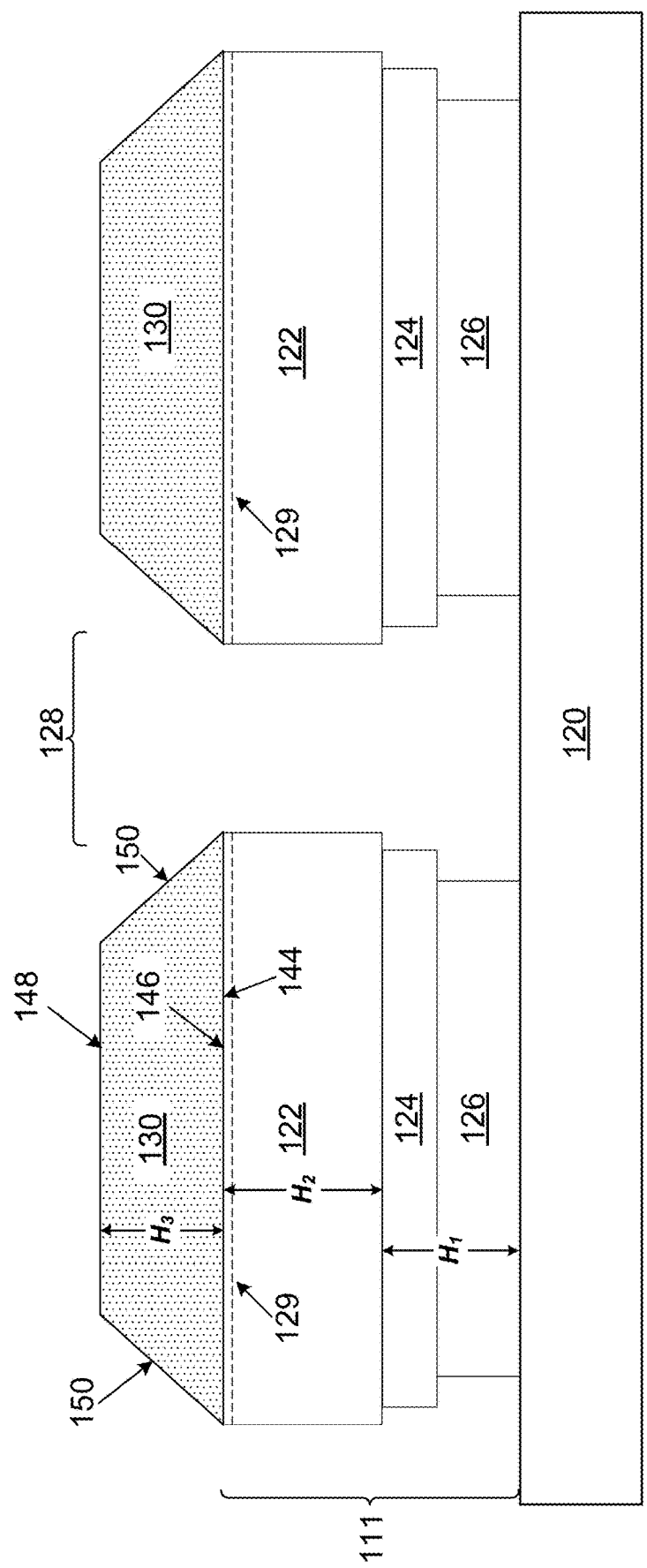
FIG. 1L shows portions of the wavelength converting layer being removed to form angled sidewalls.

FIG. 1L shows portions of the wavelength converting layer 130 being removed to form angled sidewalls 150. The portions of the wavelength converting layer 130 may be removed using a conventional etching or grinding process. The wavelength converting layer 130 may be etched such that it has it has a lower surface 146 that is substantially similar in width as an upper surface 406 of the epitaxial layer 122. The wavelength converting layer 130 may have an upper surface 148 that is smaller than the width of the upper surface 406 of the epitaxial layer 122. In an example, the upper surface 148 may have a width such than the upper surface 148 has an overall area that is than approximately 80% to approximately 90% of the upper surface 406 of the epitaxial layer 122. The wavelength converting layer 130 may have sidewalls 150 connecting the upper surface 148 and the lower surface 146. The sidewalls 150 may be angled. In an example, the sidewalls 150 may be angled between approximately 30 degrees and approximately 60 degrees in relation to the upper surface 406 of the epitaxial layer 122. The sidewalls 150 may have an angle great enough to reduce reflections within the wavelength converting layer 130 and shallow enough to reduce the need for a thick wavelength converting layer 130, both of which may reduce efficiency.

The upper surface 148 of the wavelength converting layer 130 may be symmetrically centered over the epitaxial layer 122. In another example, the upper surface 148 of the wavelength converting layer 130 may be asymmetric with respect to its location over the epitaxial layer 122. The upper surface 148 may have an area that is similar in shape, but with reduced size as compared to the epitaxial layer 122. In another example, the upper surface 148 of the wavelength converting layer 130 may have an area that is different in shape and with reduced area as compared to the epitaxial layer 122. For example, the upper surface 148 of the wavelength converting layer 130 may have an area that is circular, triangular or hexagonal on a square epitaxial layer 122. The upper surface 148 of the wavelength converting layer 130 may be tilted with respect to the upper surface 406 of the epitaxial layer 122. The may enable side-directed illumination. The upper surface 148 of the wavelength converting layer 130 may have different shapes on different pixels 111 as needed by a lighting application. For example, the upper surface 148 of the wavelength converting layer 130 on pixels 111 in a center of an array having high luminance may be smaller than the upper surface 406 of the epitaxial layer 122, while the upper surface 148 of the wavelength converting layer 130 on pixels 111 on an edge of the array may be the same size (or larger) as the upper surface 406 of the epitaxial layer 122.

Efficiency may be increased through the use of incorporated quantum dot material on the upper surface 148 of the wavelength converting layer 130. Alternatively, lenses, metal lenses, light guides, or other optical elements can be positioned above the upper surface 148 of the wavelength converting layer 130 to direct emitted light.

The upper surface 148 of the wavelength converting layer 130 may be symmetrically centered over the epitaxial layer 122. In another example, the upper surface 148 of the wavelength converting layer 130 may be asymmetric with respect to its location over the epitaxial layer 122. The upper surface 148 may have an area that is similar in shape, but with reduced size as compared to the epitaxial layer 122. In another example, the upper surface 148 of the wavelength converting layer 130 may have an area that is different in shape and with reduced area as compared to the epitaxial layer 122. For example, the upper surface 148 of the wavelength converting layer 130 may have an area that is circular, triangular or hexagonal on a square epitaxial layer 122. The upper surface 148 of the wavelength converting layer 130 may be tilted with respect to the upper surface 406 of the epitaxial layer 122. The may enable side-directed illumination. The upper surface 148 of the wavelength converting layer 130 may have different shapes on different pixels 111 as needed by a lighting application. For example, the upper surface 148 of the wavelength converting layer 130 on pixels 111 in a center of an array having high luminance may be smaller than the upper surface 406 of the epitaxial layer 122, while the upper surface 148 of the wavelength converting layer 130 on pixels 111 on an edge of the array may be the same size (or larger) as the upper surface 406 of the epitaxial layer 122.

Efficiency may be increased through the use of incorporated quantum dot material on the upper surface 148 of the wavelength converting layer 130. Alternatively, lenses, metal lenses, light guides, or other optical elements can be positioned above the upper surface 148 of the wavelength converting layer 130 to direct emitted light.

Figure 1M:
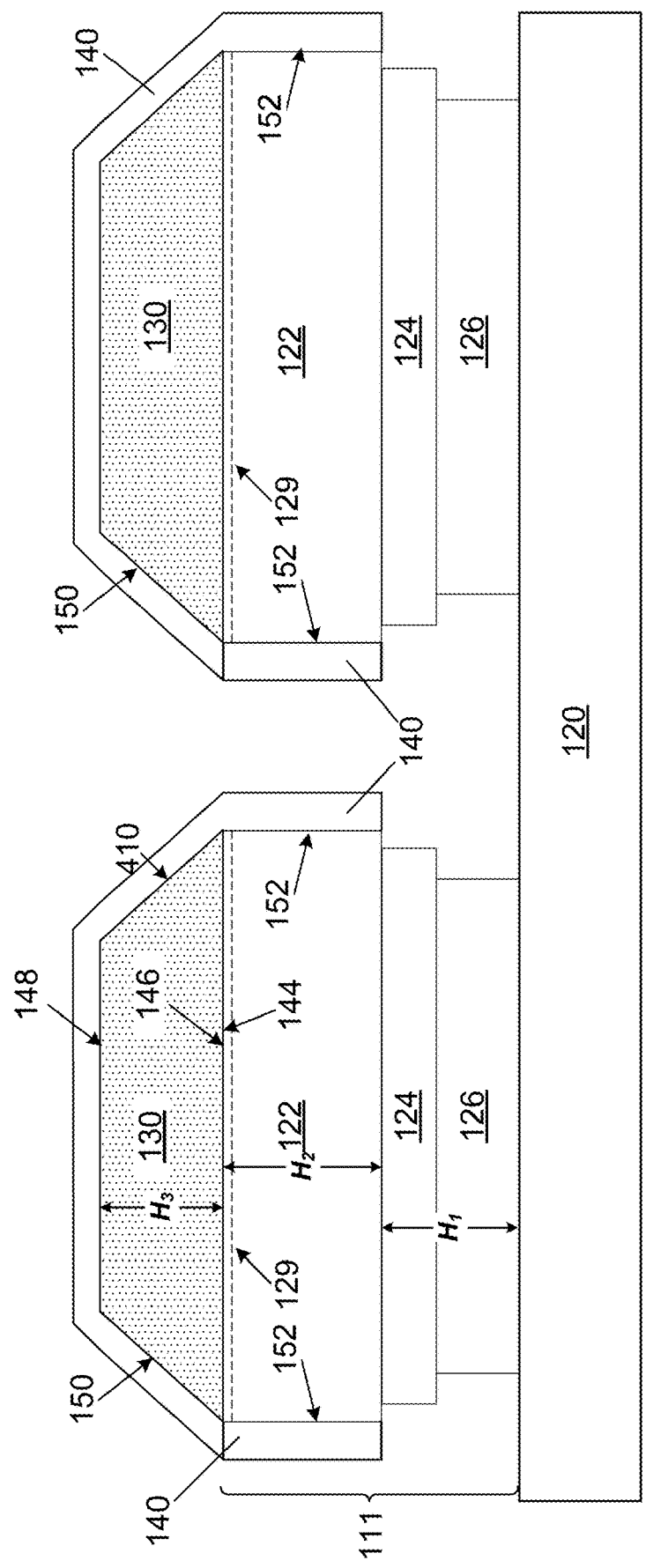
FIG. 1M shows the formation of the non-emission layer on the wavelength converting layer and the epitaxial layer.

FIG. 1M shows the formation of the non-emission layer 140 on the wavelength converting layer 130 and the epitaxial layer 122. The non-emission layer 140 may reflect or absorb light emitted by the epitaxial layer 122 and the wavelength converting layer 130. The non-emission layer 140 may include one or more optical isolation materials such as distributed Bragg reflector (DBR) layers, reflective materials, absorptive materials, or the like. The non-emission layer 140 may include combinations of DBR, absorbers, laser blackened areas, and metallization to improve optical isolation between pixels 111 and reduce the exposed upper surface 148 of the wavelength converting layer 130.

The non-emission layer 140 may be formed using a conformal deposition process, such as, for example, atomic layer deposition (ALD). The non-emission layer 140 may be formed on sidewalls of the epitaxial layer 122, the sidewalls 150 of the wavelength converting layer 130 and the upper surface 148 of the wavelength converting layer 130. The sidewalls 150 of the wavelength converting layer 130 and the sidewalls 152 of the epitaxial layer 122 may be partially or completed covered by the non-emission layer 140. The non-emission layer 140 may extend across the trench 128 from the sidewalls 150 of one wavelength converting layer 130 to the sidewalls 150 of another wavelength converting layer 130. In another example, the non-emission layer 140 may be formed on the isolation layer and the epitaxial layer 122 before the wavelength converting layer 130 is affixed.

Figure 1N:
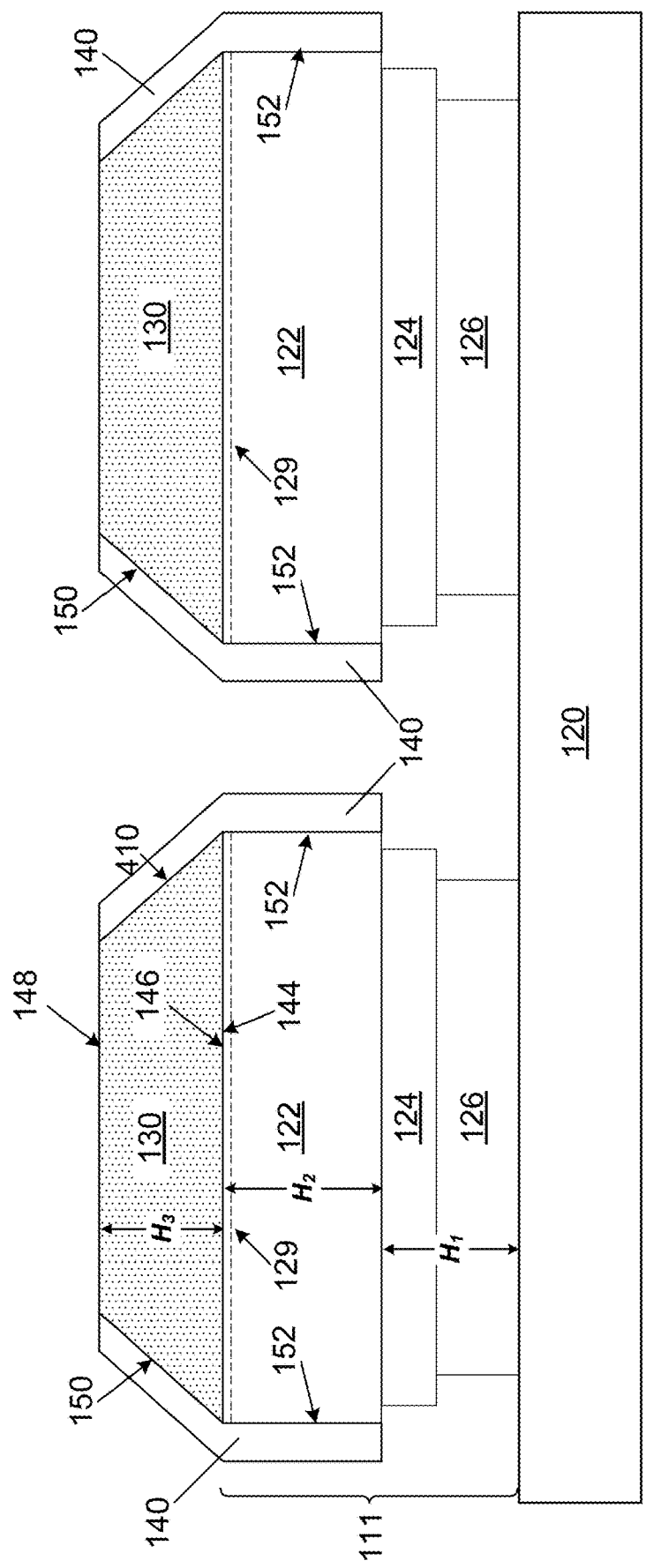
FIG. 1N shows removing a portion of the non-emission layer to expose the upper surface of the wavelength converting layer.
Figure 10:
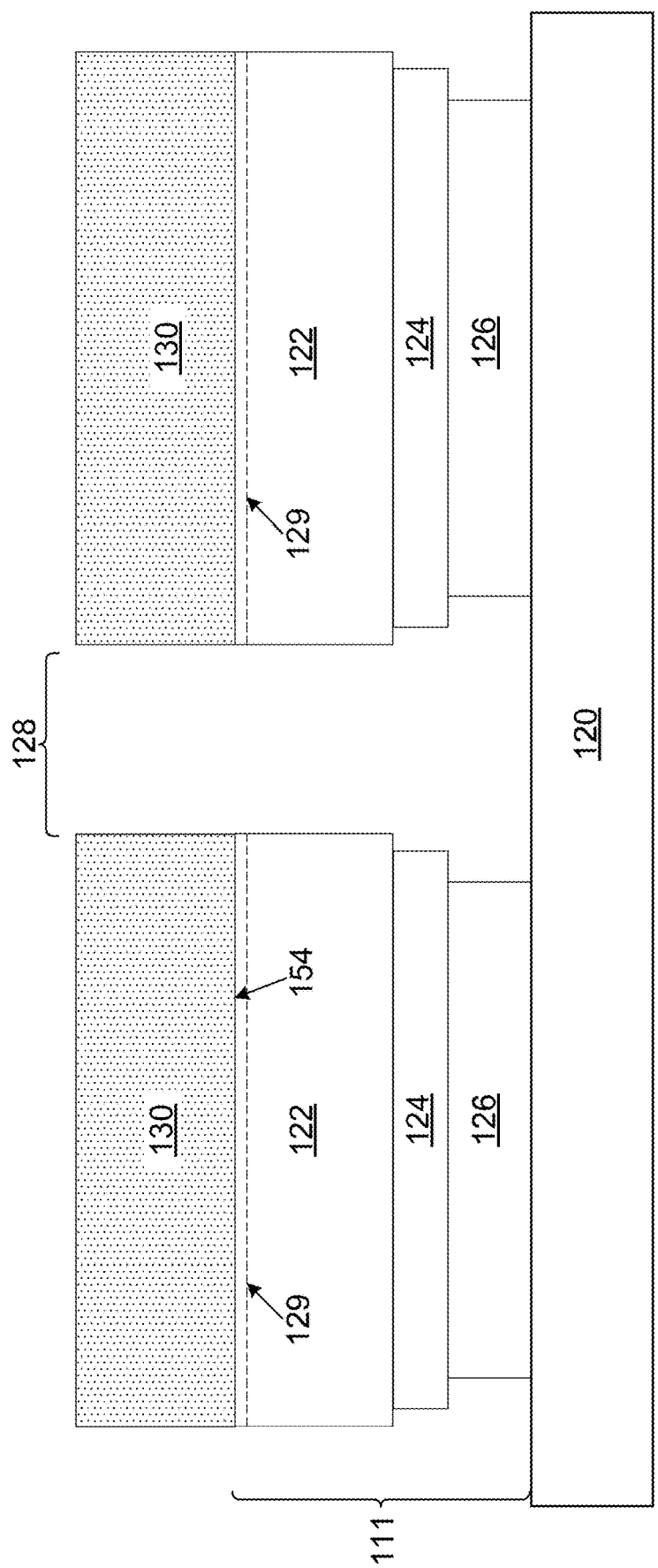

FIG. 1N shows removing a portion of the non-emission layer 140 to expose the upper surface 148 of the wavelength converting layer 130. The portion of the non-emission layer may be removed using conventional grinding techniques, such as, for example planarization and CMP.

Referring now to FIGS. 1O-1R, cross section views illustrating another example of forming the wavelength converting layer 130 on the epitaxial layer 122 are shown. FIG. 1O shows forming the wavelength converting layer 130 directly on a upper surface 154 of the epitaxial layer 122.

The wavelength converting layer 130 may include one or more wavelength converting materials. The one or more wavelength converting materials may be, for example, one or more powder phosphors disposed in a transparent material such as silicone or epoxy and deposited on the LED by screen printing or stenciling. The one or more wavelength converting materials may be one or more powder phosphors formed by electrophoretic deposition, spraying, sedimenting, evaporation, or sputtering. The one or more wavelength converting materials may be one or more ceramic phosphors glued or bonded to the pixel 111. The wavelength converting materials may be formed such that a portion of light emitted by the light emitting region may be unconverted by the wavelength converting material. In some examples, the unconverted light may blue and the converted light may be yellow, green, and/or red, such that the combination of unconverted and converted light emitted from the device appears white. The wavelength converting layer 130 may be individually formed on each pixel 111.

The wavelength converting layer 130 may include elemental phosphor or compounds thereof. The wavelength converting layer 130 may contain one or more phosphors. Phosphors are luminescent materials that may absorb an excitation energy (usually radiation energy), and then emit the absorbed energy as radiation of a different energy than the initial excitation energy. The phosphors may have quantum efficiencies near 100%, meaning nearly all photons provided as excitation energy may be reemitted by the phosphors. The phosphors may also be highly absorbent. Because the light emitting active region may emit light directly into the highly efficient, highly absorbent wavelength converting layer 130, the phosphors may efficiently extract light from the device. The phosphors used in the wavelength converting layer 130 may include, but are not limited to any conventional green, yellow, and red emitting phosphors.

The wavelength converting layer 130 may contain phosphor grains. The phosphor grains may be in direct contact with the epitaxial layer 122, such that light emitted from the active region may be directly coupled to the phosphor grains. An optical coupling medium may be provided to hold the phosphor grains in place. The optical coupling medium may be selected to have a refractive index that is as close as possible without significantly exceeding the index of refraction of the epitaxial layer 122. For most efficient operation, no lossy media may be included between the epitaxial layer 122, the phosphor grains of the wavelength converting layer 130, and the optical coupling medium. The phosphor grains may have a grain size between 0.1 µm and 20 µm.

The wavelength converting layer 130 may be formed using a conventional deposition technique, such as, for example, chemical vapor deposition (CVD), plasma enhanced chemical vapor deposition (PECVD), metal organic chemical vapor deposition (MOCVD), ALD, evaporation, reactive sputtering, chemical solution deposition, spin-on deposition, or other like processes The wavelength converting layer 130 may be formed using electrophoretic deposition, spin coating, spray coating, screen printing, or other printing techniques. In techniques such as spin coating or spray coating, the phosphor may be disposed in a slurry with an organic binder, which may then evaporated after deposit of the slurry by, for example, heating. Optionally, the optical coupling medium may then be applied. Phosphor particles may be nanoparticles themselves (i.e., particles ranging from 100 nm to 1000 nm in size). Spherical phosphor particles, typically produced by spray pyrolysis methods or other methods can be applied, yielding a layer with a high package density which provides advantageous scattering properties. Also, phosphors particles may be coated, for example with a material with a band gap larger than the light emitted by the phosphor, such as $SiO_2$, $Al_2O_3$, $MePO_4$ or -polyphosphate, or other suitable metal oxides. A masking layer may be used to ensure that the wavelength converting layer 130 is formed only on the upper surface 154 of the epitaxial layer 122.

Figure 1P:
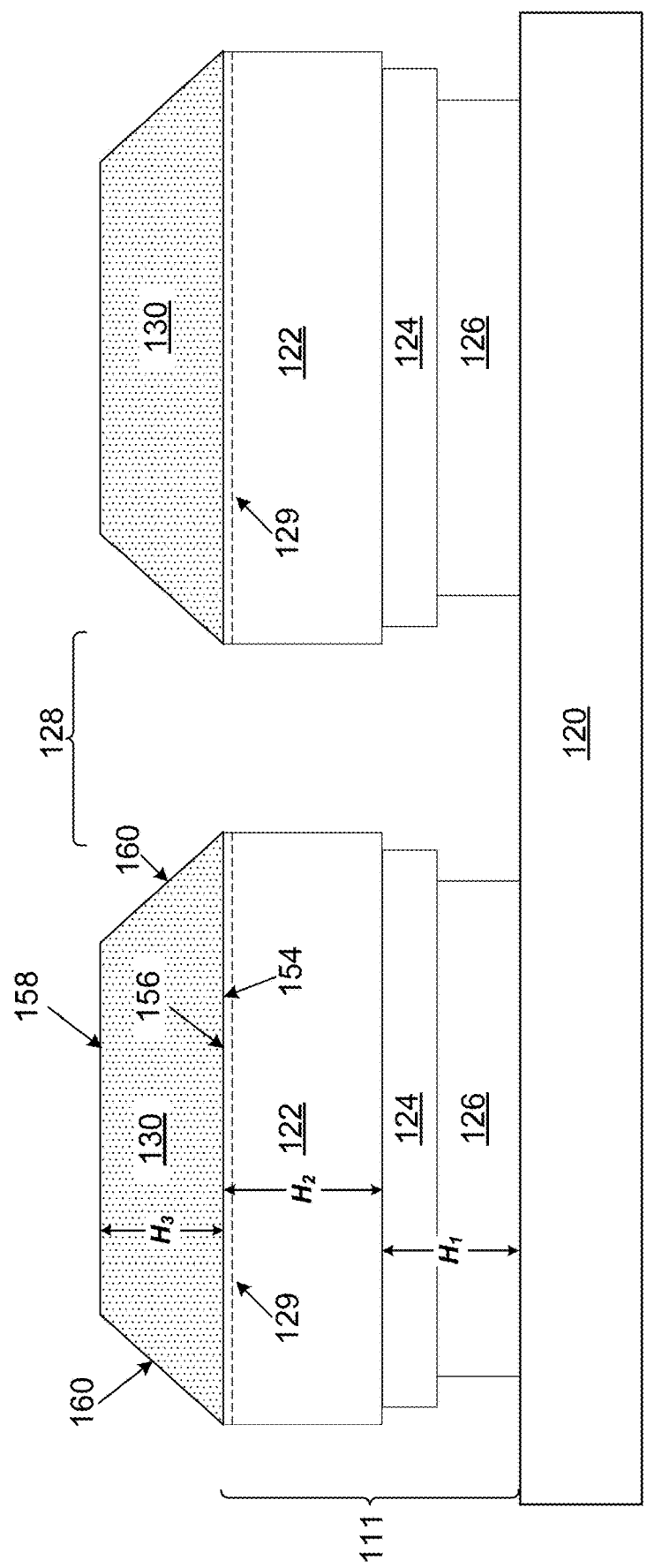
FIG. 1P shows portions of the wavelength converting layer being removed to form angled sidewalls.

FIG. 1P shows portions of the wavelength converting layer 130 being removed to form angled sidewalls 160. The portions of the wavelength converting layer 130 may be removed using a conventional etching or grinding process. The wavelength converting layer 130 may be etched such that it has it has a lower surface 156 that is substantially similar in width as an upper surface 506 of the epitaxial layer 122. The wavelength converting layer 130 may have an upper surface 158 that is smaller than the width of the upper surface 506 of the epitaxial layer 122. In an example, the upper surface 158 may have a width such than the upper surface 158 has an overall area that is than approximately 80% to approximately 90% of the upper surface 506 of the epitaxial layer 122. The wavelength converting layer 130 may have sidewalls 160 connecting the upper surface 158 and the lower surface 156. The sidewalls 160 may be angled. In an example, the sidewalls 160 may be angled between approximately 30 degrees and approximately 60 degrees in relation to the upper surface 506 of the epitaxial layer 122. The sidewalls 160 may have an angle great enough to reduce reflections within the wavelength converting layer 130 and shallow enough to reduce the need for a thick wavelength converting layer 130, both of which may reduce efficiency.

The upper surface 158 of the wavelength converting layer 130 may be symmetrically centered over the epitaxial layer 122. In another example, the upper surface 158 of the wavelength converting layer 130 may be asymmetric with respect to its location over the epitaxial layer 122. The upper surface 158 may have an area that is similar in shape, but with reduced size as compared to the epitaxial layer 122. In another example, the upper surface 158 of the wavelength converting layer 130 may have an area that is different in shape and with reduced area as compared to the epitaxial layer 122. For example, the upper surface 158 of the wavelength converting layer 130 may have an area that is circular, triangular or hexagonal on a square epitaxial layer 122. The upper surface 158 of the wavelength converting layer 130 may be tilted with respect to the upper surface 506 of the epitaxial layer 122. The may enable side-directed illumination. The upper surface 158 of the wavelength converting layer 130 may have different shapes on different pixels 111 as needed by a lighting application. For example, the upper surface 158 of the wavelength converting layer 130 on pixels 111 in a center of an array having high luminance may be smaller than the upper surface 506 of the epitaxial layer 122, while the upper surface 158 of the wavelength converting layer 130 on pixels 111 on an edge of the array may be the same size (or larger) as the upper surface 506 of the epitaxial layer 122.

Efficiency may be increased through the use of incorporated quantum dot material on the upper surface 158 of the wavelength converting layer 130. Alternatively, lenses, metal lenses, light guides, or other optical elements can be positioned above the upper surface 158 of the wavelength converting layer 130 to direct emitted light.

The upper surface 158 of the wavelength converting layer 130 may be symmetrically centered over the epitaxial layer 122. In another example, the upper surface 158 of the wavelength converting layer 130 may be asymmetric with respect to its location over the epitaxial layer 122. The upper surface 158 may have an area that is similar in shape, but with reduced size as compared to the epitaxial layer 122. In another example, the upper surface 158 of the wavelength converting layer 130 may have an area that is different in shape and with reduced area as compared to the epitaxial layer 122. For example, the upper surface 158 of the wavelength converting layer 130 may have an area that is circular, triangular or hexagonal on a square epitaxial layer 122. The upper surface 158 of the wavelength converting layer 130 may be tilted with respect to the upper surface 506 of the epitaxial layer 122. The may enable side-directed illumination. The upper surface 158 of the wavelength converting layer 130 may have different shapes on different pixels 111 as needed by a lighting application. For example, the upper surface 158 of the wavelength converting layer 130 on pixels 111 in a center of an array having high luminance may be smaller than the upper surface 506 of the epitaxial layer 122, while the upper surface 158 of the wavelength converting layer 130 on pixels 111 on an edge of the array may be the same size (or larger) as the upper surface 506 of the epitaxial layer 122.

Efficiency may be increased through the use of incorporated quantum dot material on the upper surface 158 of the wavelength converting layer 130. Alternatively, lenses, metal lenses, light guides, or other optical elements can be positioned above the upper surface 158 of the wavelength converting layer 130 to direct emitted light.

Figure 1Q:
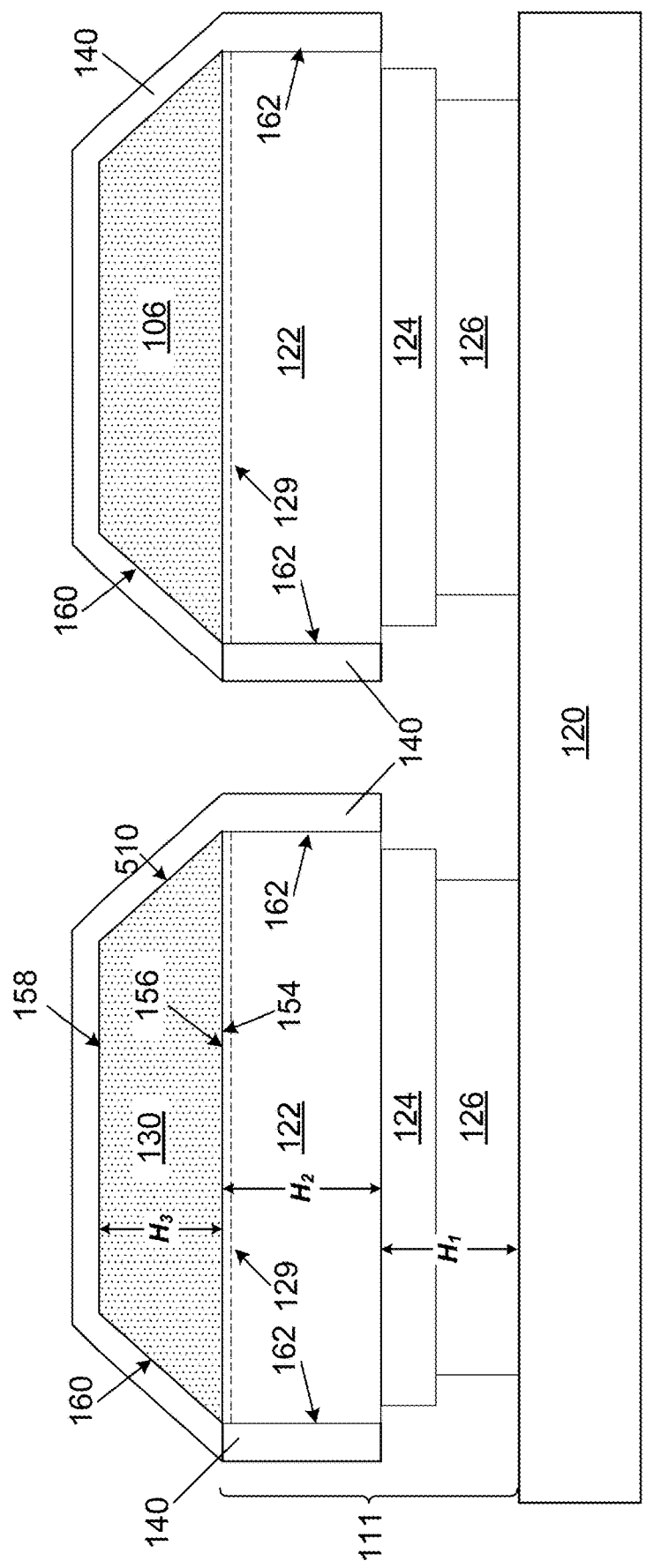
FIG. 1Q shows the formation of the non-emission layer on the wavelength converting layer and the epitaxial layer.

FIG. 1Q shows the formation of the non-emission layer 140 on the wavelength converting layer 130 and the epitaxial layer 122. The non-emission layer 140 may reflect or absorb light emitted by the epitaxial layer 122 and the wavelength converting layer 130. The non-emission layer 140 may include one or more optical isolation materials such as distributed Bragg reflector (DBR) layers, reflective materials, absorptive materials, or the like. The non-emission layer 140 may include combinations of DBR, absorbers, laser blackened areas, and metallization to improve optical isolation between pixels 111 and reduce the exposed upper surface 158 of the wavelength converting layer 130.

The non-emission layer 140 may be formed using a conformal deposition process, such as, for example, atomic layer deposition (ALD). The non-emission layer 140 may be formed on sidewalls of the epitaxial layer 122, the sidewalls 160 of the wavelength converting layer 130 and the upper surface 158 of the wavelength converting layer 130. The sidewalls 160 of the wavelength converting layer 130 and the sidewalls 162 of the epitaxial layer 122 may be partially or completed covered by the non-emission layer 140. The non-emission layer 140 may extend across the trench 128 from the sidewalls 160 of one wavelength converting layer 130 to the sidewalls 160 of another wavelength converting layer 130. In another example, the non-emission layer 140 may be formed on the isolation layer and the epitaxial layer 122 before the wavelength converting layer 130 is affixed.

Figure 1R:
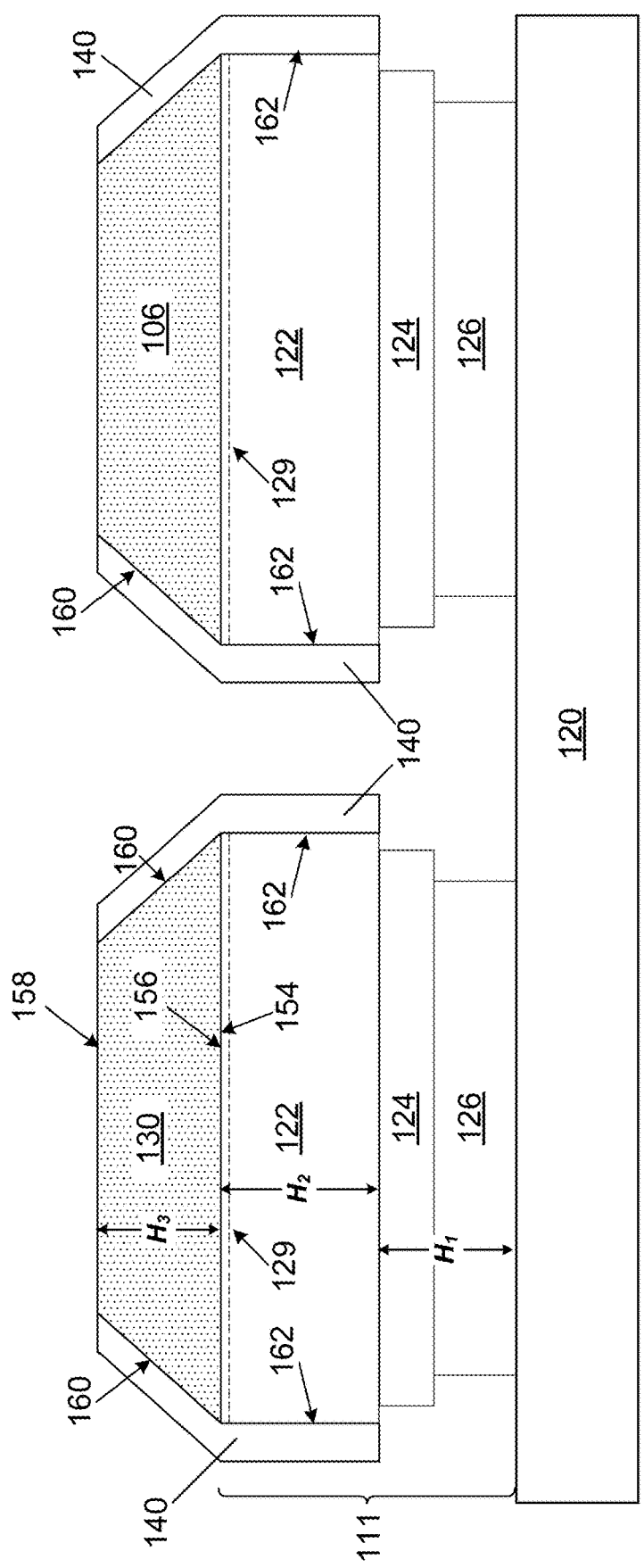
FIG. 1R shows removing a portion of the non-emission layer to expose the upper surface of the wavelength converting layer.

FIG. 1R shows removing a portion of the non-emission layer 140 to expose the upper surface 158 of the wavelength converting layer 130. The portion of the non-emission layer may be removed using conventional grinding techniques, such as, for example planarization and CMP.

Figure 1S:
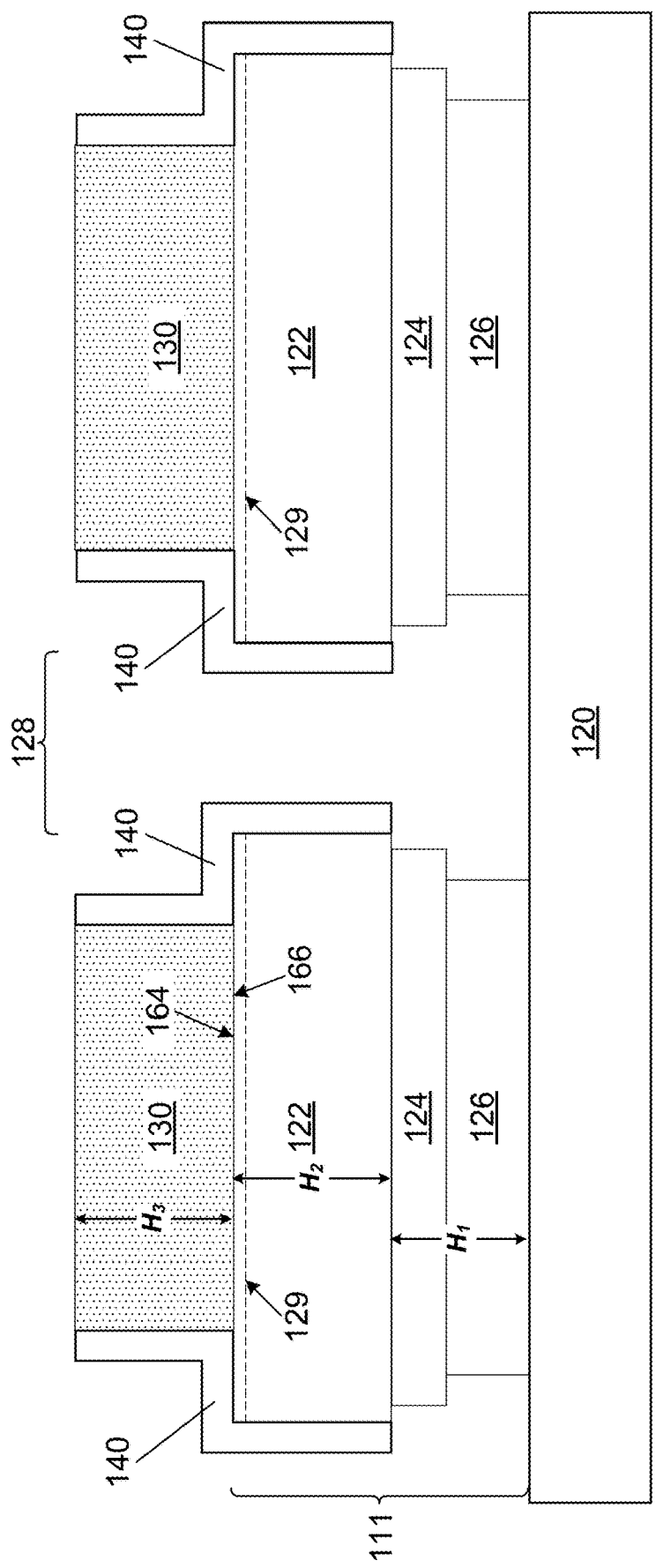
FIG. 1S is a cross-section view illustrating another example of forming the wavelength converting layer on the epitaxial layer.

Referring now to FIG. 1S, a cross-section view illustrating another example of forming the wavelength converting layer 130 on the epitaxial layer 122 is shown. The wavelength converting layer 130 and the non-emission layer 140 may be formed using any of the techniques described above. However, as shown in FIG. 1S, a lower surface 164 of the wavelength converting layer 130 may have a width less than an upper surface 164 of the epitaxial layer 122. Accordingly, the non-emission layer may also be formed on the upper surface 166 of the epitaxial layer 122.

Figure 1T:
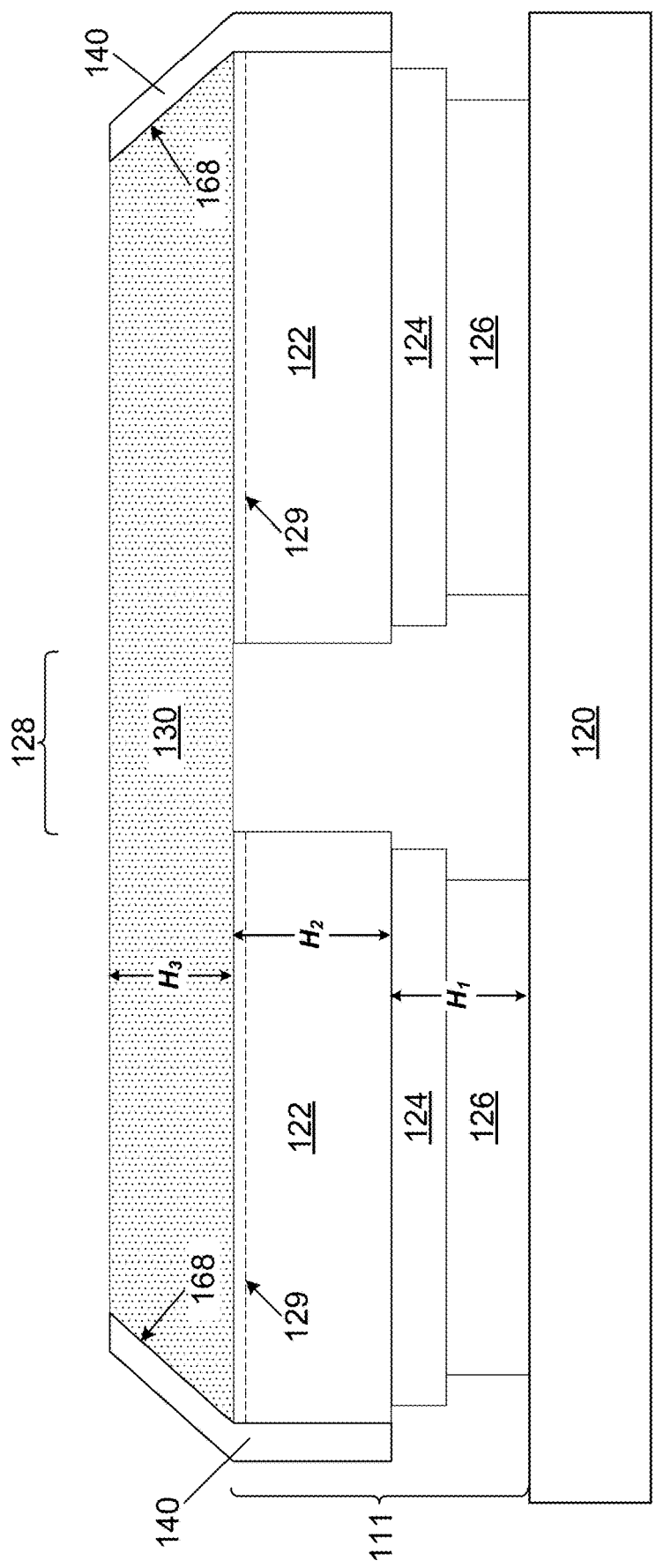
FIG. 1T shows affixing the wavelength converting layer to the pixels.
Figure 1U:
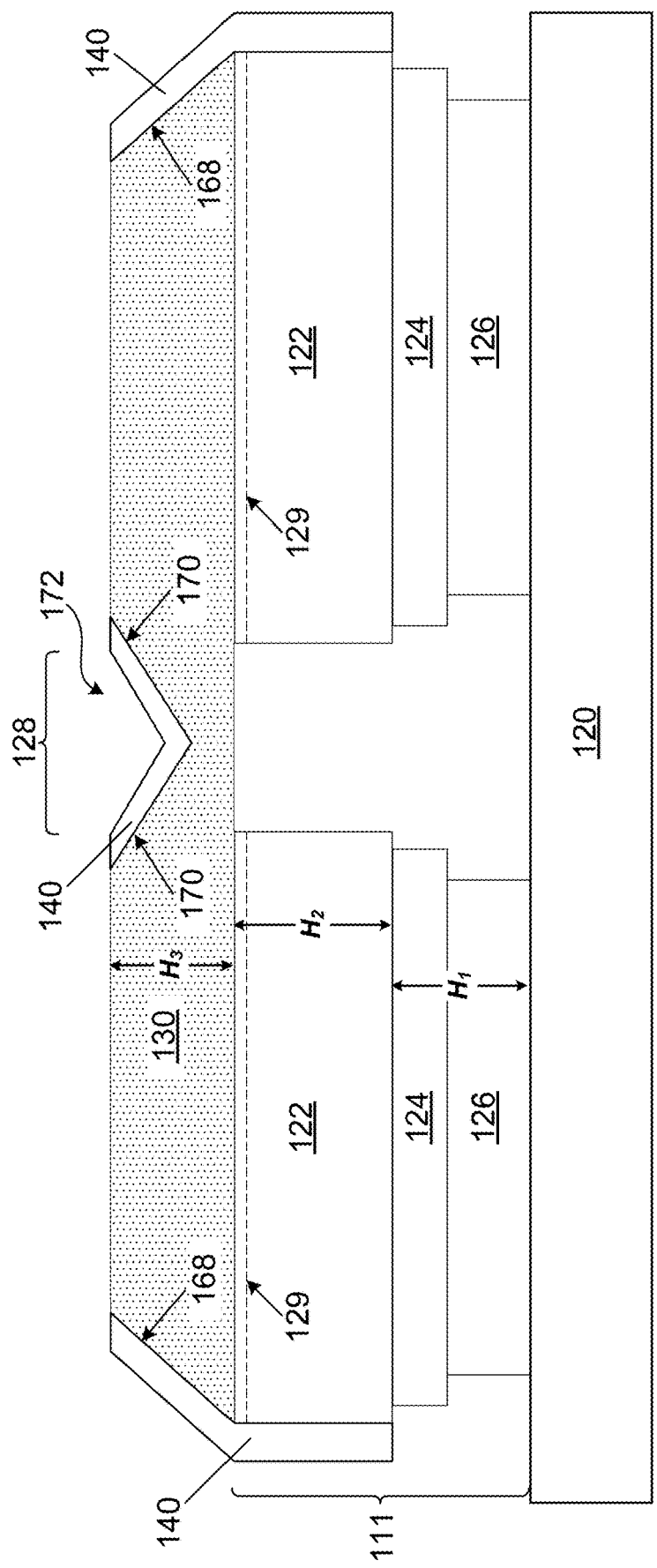
FIG. 1U shows an optional step of removing a portion of the wavelength converting layer over a trench between pixels to form a trench with second sidewalls.
Figure 1V:
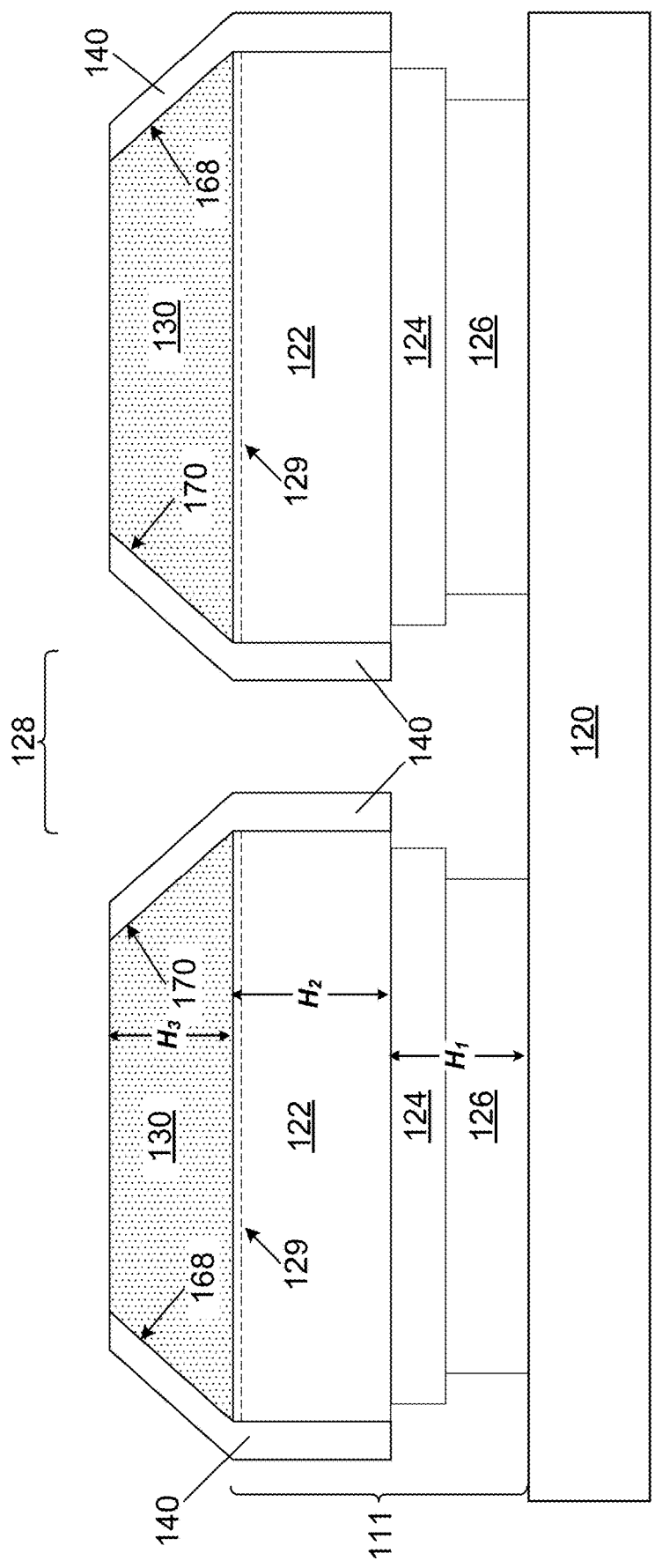
FIG. 1V shows an optional step of removing a portion of the wavelength converting layer over the trench completely.

Referring now to FIG. 1T-1V, cross-section views illustrating another example of forming the wavelength converting layer 130 on the epitaxial layer 122 are shown. FIG. 1T shows affixing the wavelength converting layer 130 to the pixels 111. The wavelength converting layer 130 may be affixed using similar techniques as those described above with reference to FIGS. 1E-1M. Accordingly, first sidewalls 168 may be formed before or after the wavelength converting layer 130 is affixed to the pixels 111. However, the wavelength converting layer 130 may be one continuous piece over more than one pixel 111. The non-emission layer 140 may be formed using similar techniques as those described above.

FIG. 1U shows an optional step of removing a portion of the wavelength converting layer 130 over the trench 128 to form a trench 172 with second sidewalls 170. The portion may be removed using any conventional patterning and etching process. It should be noted that the trench 172 may be any shape that may be formed by etching. The non-emission layer 140 may also be formed in the trench 172.

FIG. 1V shows an optional step of removing a portion of the wavelength converting layer 130 over the trench 128 completely. The second sidewalls 170 may resemble the angled sidewalls described above. Accordingly, the non-emission layer 140 may be formed on the second sidewalls 170 using similar techniques as those described above.

Figure 1W:
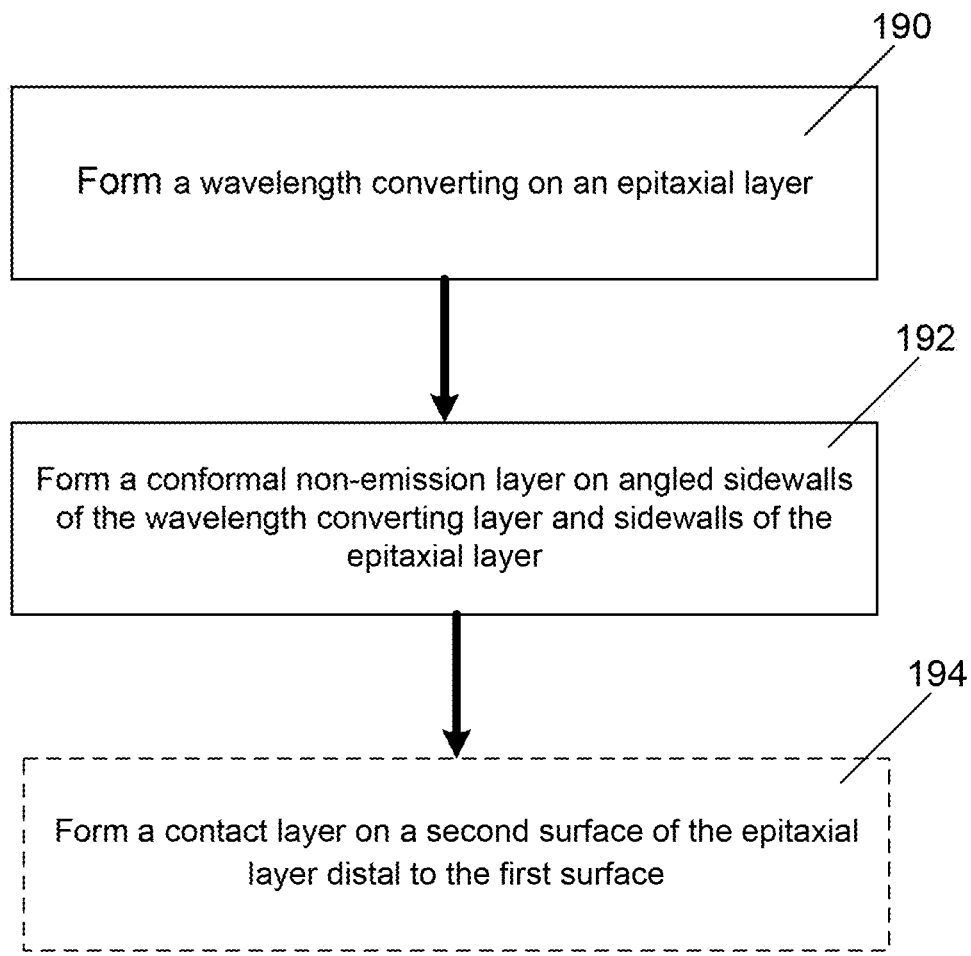
FIG. 1W is a flowchart illustrating a method of forming a device.

Referring now to FIG. 1W, a flowchart illustrating a method of forming a device is shown. In step 190, a wavelength converting layer may be formed on an epitaxial layer. The wavelength converting layer may include a first surface having a width that is equal to a width of the epitaxial layer, a second surface having a width that is less than the width of the first surface, and angled sidewalls. In step 192, a conformal non-emission layer may be formed on the angled sidewalls and sidewalls of the epitaxial layer, such that the second surface of the wavelength converting layer is exposed. In optional step 194, a contact layer may be formed on a second surface of the epitaxial layer distal to the first surface. The first contact layer may be connected to a mount through a bonding layer. In an example, the wavelength converting layer may be formed directly on the epitaxial layer. It should be noted that the term "distal" as used herein may be used as a directional term to mean a spatially opposites sides of an element, device, layer, or other structure. A first element and a second element that are on distal sides of a third element may be separated from one another by at least a portion of the third element. For example, an upper surface of a layer may be distal to a lower surface of the layer.

Figure 2A:
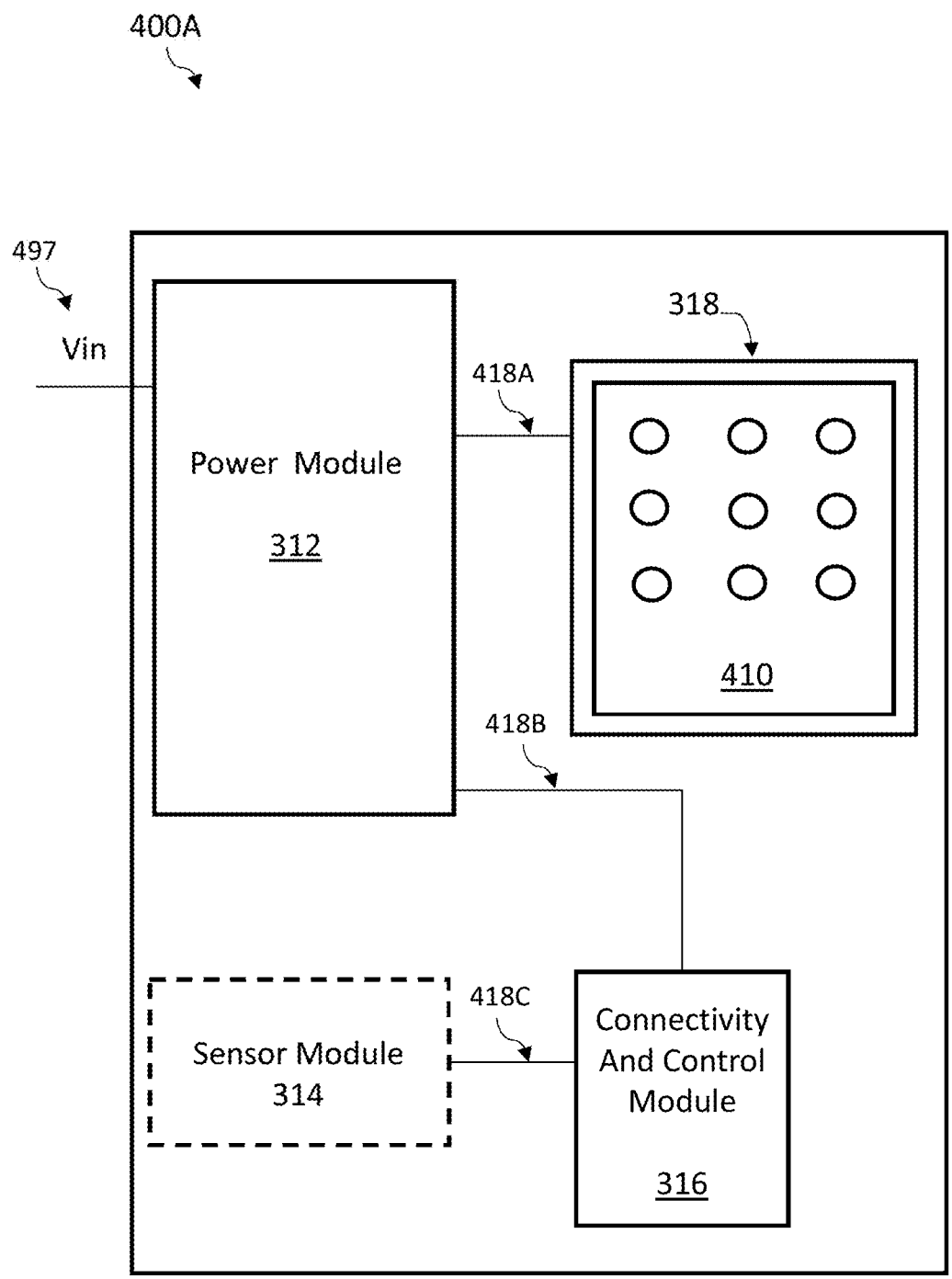
FIG. 2A is a top view of the electronics board with LED array attached to the substrate at the LED device attach region in one embodiment.

FIG. 2A is a top view of an electronics board with an LED array 410 attached to a substrate at the LED device attach region 318 in one embodiment. The electronics board together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 2A, the connectivity and control module 316 receives sensor signals from the sensor module 314 over trace 4180.

Figure 2B:
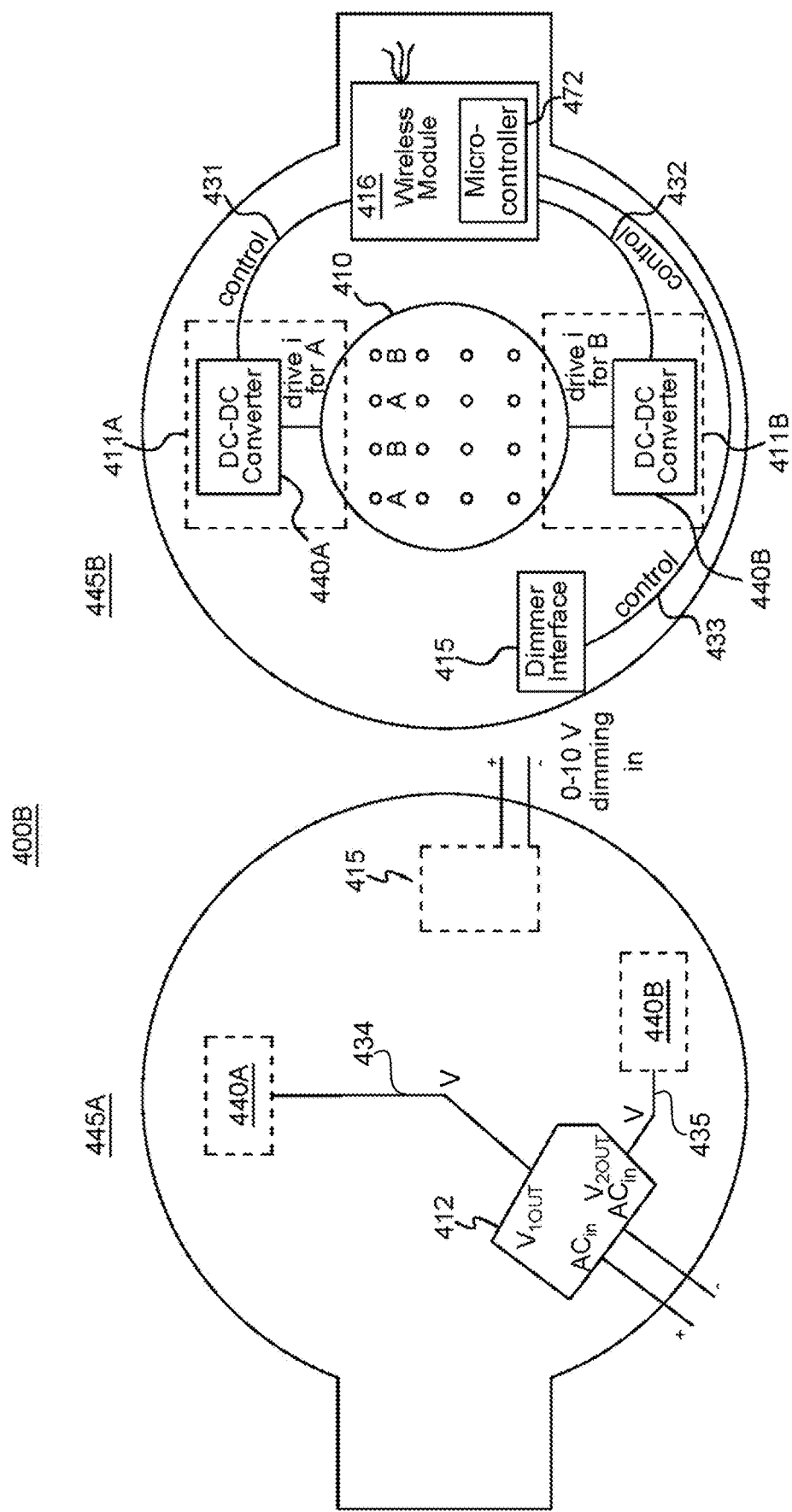
FIG. 2B is a diagram of one embodiment of a two channel integrated LED lighting system with electronic components mounted on two surfaces of a circuit board.

FIG. 2B illustrates one embodiment of a two channel integrated LED lighting system with electronic components mounted on two surfaces of a circuit board 499. As shown in FIG. 2B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 2B does not include a sensor module (as described in FIG. 2A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

FIG. 2C shows an example vehicle headlamp system 300 including a vehicle power 302 including a data bus 304. A sensor module 307 may be connected to the data bus 304 to provide data related to environment conditions (e.g. ambient light conditions, temperature, time, rain, fog, etc), vehicle condition (parked, in-motion, speed, direction), presence/position of other vehicles, pedestrians, objects, or the like. The sensor module 307 may be similar to or the same as the sensor module 314 of FIG. 2A. AC/DC Converter 305 may be connected to the vehicle power 302.

The AC/DC converter 312 of FIG. 2C may be the same as or similar to the AC/DC converter 412 of FIG. 2B and may receive AC power from the vehicle power 302. It may convert the AC power to DC power as described in FIG. 2B for AC-DC converter 412. The vehicle head lamp system 300 may include an active head lamp 330 which receives one or more inputs provided by or based on the AC/DC converter 305, connectivity and control module 306, and/or sensor module 307. As an example, the sensor module 307 may detect the presence of a pedestrian such that the pedestrian is not well lit, which may reduce the likelihood that a driver sees the pedestrian. Based on such sensor input, the connectivity and control module 306 may output data to the active head lamp 330 using power provided from the AC/DC converter 305 such that the output data activates a subset of LEDs in an LED array contained within active head lamp 330. The subset of LEDs in the LED array, when activated, may emit light in the direction where the sensor module 307 sensed the presence of the pedestrian. These subset of LEDs may be deactivated or their light beam direction may otherwise be modified after the sensor module 207 provides updated data confirming that the pedestrian is no longer in a path of the vehicle that includes vehicle head lamp system.

Figure 3:
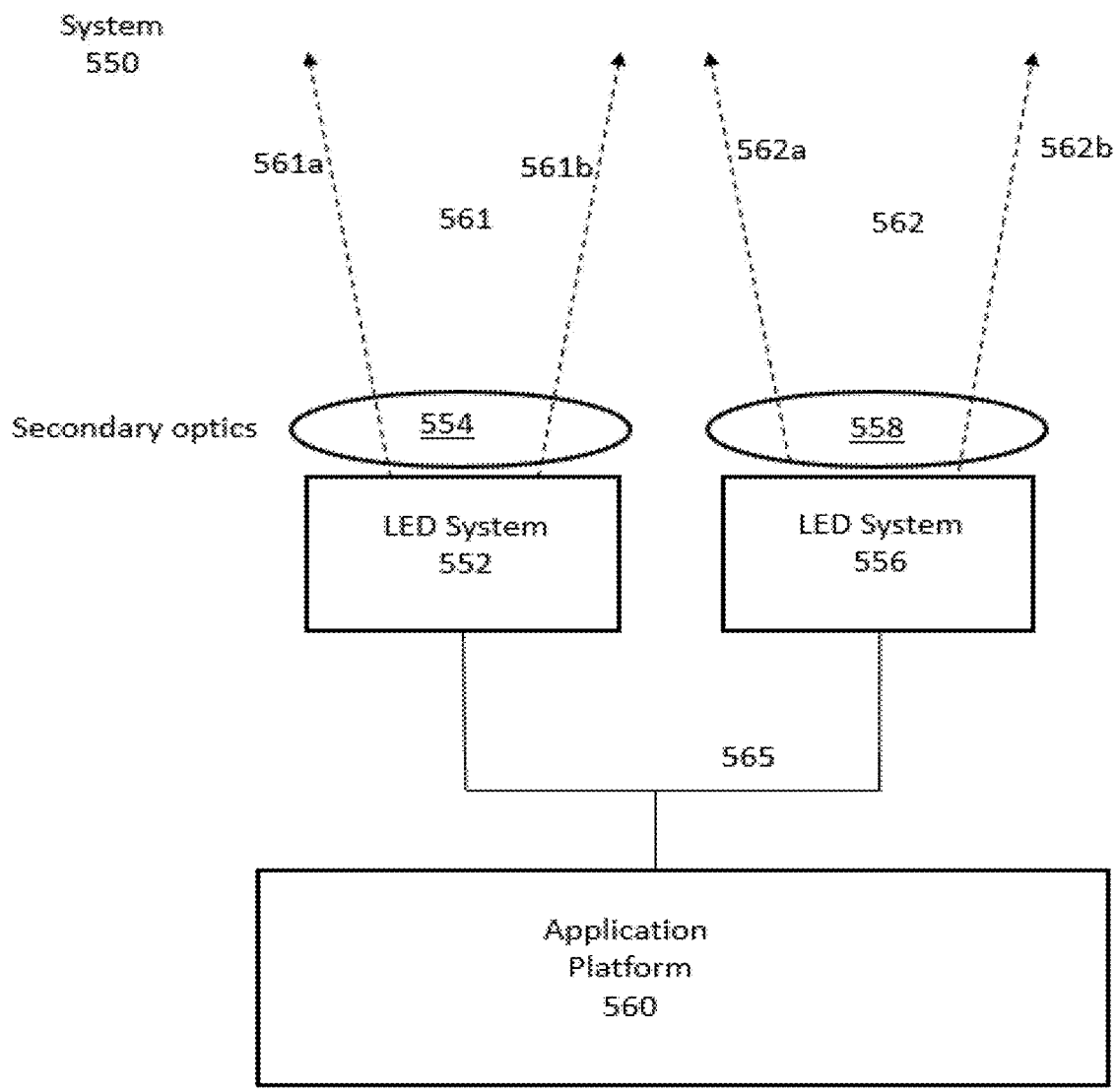
FIG. 3 shows an example illumination system.

FIG. 3 shows an example system 550 which includes an application platform 560, LED systems 552 and 556, and optics 554 and 558. The LED System 552 produces light beams 561 shown between arrows 561a and 561b. The LED System 556 may produce light beams 562 between arrows 562a and 562b. In the embodiment shown in FIG. 3, the light emitted from LED System 552 passes through secondary optics 554, and the light emitted from the LED System 556 passes through secondary optics 558. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 2A and vehicle head lamp system 300 shown in FIG. 2C illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560. Alternatively or in addition, as shown in the LED system 400 of FIG. 2A, each LED System 552 and 556 may include its own sensor module, connectivity and control module, power module, and/or LED devices.

In embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors (e.g., similar to sensors module 314 of FIG. 2A and 307 of FIG. 2C) that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

The invention claimed is:

1. A light emitting diode (LED) array comprising:
   a first pixel comprising a first epitaxial layer and a second pixel comprising a second epitaxial layer, each of the first epitaxial layer and the second epitaxial layer emitting light in operation and comprising a p-type region, an active region on the p-type region, and an n-type region on the active region;
   a first wavelength converting layer on a first pixel and a second wavelength converting layer on a second pixel, each of the first wavelength converting layer and the second wavelength converting layer on and in direct contact with respective ones of the first epitaxial layer and the second epitaxial layer, the first wavelength converting layer comprising angled sidewalls, a first contact surface directly contacting the first epitaxial layer and having a width that is equal to a width of the first epitaxial layer, and a first emission surface comprising an inner portion and an outer edge portion surrounding the inner portion, the first emission surface having a width less than the width of the first contact surface; and
   a thin conformal layer disposed on the angled sidewalls of the first wavelength converting layer and comprising a reflective material, the thin conformal layer disposed on and in direct contact with the outer edge portion of the first emission surface of the first wavelength converting layer without being disposed on the inner portion so as to leave the inner portion exposed.

2. The LED array of claim 1, further comprising:
   a first layer on a second surface of the first pixel distal to the wavelength converting layer; and
   a second layer on a second surface of the second pixel distal to the wavelength converting layer, the first layer and the second layer each connected to a mount through a bonding layer.

3. The light emitting diode array of claim 1, wherein the light emitting diode array is a monolithic segmented light emitting diode array.

4. The light emitting diode array of claim 1, further comprising center pixels comprising the first pixel and edge pixels comprising the second pixel,
   wherein the second wavelength converting layer comprises a second emission surface and a second contact surface on and in direct contact with the second epitaxial layer, the contact surface and the emission surface each having a width that is equal to a width of the second epitaxial layer.

5. The light emitting diode array of claim 1, wherein a distance from a center of the first pixel to a center of the second pixel is 120 µm or less.

6. The light emitting diode array of claim 1, wherein a width between edges of adjacent pixels is 20 µm or less.

7. The light emitting diode array of claim 1, wherein a height of the first wavelength converting layer is a same height as a height of the first epitaxial layer.

8. The light emitting diode array of claim 7, wherein the height of the first wavelength converting layer is 5 µm to 100 µm.

9. The light emitting diode array of claim 1, wherein a height of the first wavelength converting layer is from 5 to 6 times larger than a height of the first epitaxial layer.

10. The light emitting diode array of claim 9, wherein the height of the first epitaxial layer is 3 µm to 20 µm.

11. The light emitting diode array of claim 1, wherein the width of the first emission surface is less than 80% of the width of the first contact surface.

12. The light emitting diode array of claim 1, wherein the thin conformal layer comprises an absorptive material.

13. The light emitting diode array of claim 1, wherein the angled sidewalls have an angle between approximately 30 degrees and approximately 60 degrees in relation to the first surface of the epitaxial layer.

14. The light emitting diode array of claim 4, wherein sidewalls of the second wavelength converting layer are perpendicular to the second contact surface.

15. The light emitting diode array of claim 1, wherein the first epitaxial layer has a first epitaxial surface directly contacting the first contact surface of the first wavelength converting layer, the first epitaxial layer has a second epitaxial surface opposite the first epitaxial surface, and a width of the first epitaxial surface and a width of the second epitaxial surface are equal to each other and to a maximum width of the first epitaxial layer.

16. The light emitting diode array of claim 1, wherein the first pixel is not in direct contact with the second pixel.

17. The light emitting diode array of claim 1, wherein the first wavelength converting layer has a different shape from that of the first epitaxial layer.

18. The light emitting diode array of claim 15, wherein the width of the first emission surface is less than the width of the first epitaxial surface and the width of the first emission surface is less than the width of the second epitaxial surface.

19. The light emitting diode array of claim 1, wherein the width of the first emission surface is less than the width of the first epitaxial layer.

* * * * *